(12) United States Patent
Kato

(10) Patent No.: US 8,040,933 B2
(45) Date of Patent: Oct. 18, 2011

(54) DIFFRACTION GRATING DEVICE, LASER DIODE, AND WAVELENGTH TUNABLE FILTER

(75) Inventor: Takashi Kato, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 4 days.

(21) Appl. No.: 12/379,876

(22) Filed: Mar. 3, 2009

(65) Prior Publication Data

US 2009/0225796 A1 Sep. 10, 2009

(30) Foreign Application Priority Data

Mar. 10, 2008 (JP) ................................. 2008-060142

(51) Int. Cl.
*H01S 5/00* (2006.01)
(52) U.S. Cl. ...................... 372/50.11; 372/50.1; 372/102
(58) Field of Classification Search ............... 372/50.11, 372/50.1, 102
See application file for complete search history.

(56) References Cited

U.S. PATENT DOCUMENTS

| | | | | |
|---|---|---|---|---|
| 5,553,091 | A * | 9/1996 | Delorme | 372/50.23 |
| 6,198,863 | B1 * | 3/2001 | Lealman et al. | 385/37 |
| 6,822,980 | B2 * | 11/2004 | Lundqvist | 372/20 |
| 7,151,789 | B2 * | 12/2006 | Jette et al. | 372/102 |
| 7,529,279 | B2 * | 5/2009 | Reid | 372/20 |
| 2003/0063647 | A1 * | 4/2003 | Yoshida et al. | 372/50 |

OTHER PUBLICATIONS

Optical integrated device, Kohroh Kobayashi, Kyoritsu Shuppan Co., Ltd., 1999, p. 116-120 and English translation.

* cited by examiner

*Primary Examiner* — Kinam Park
(74) *Attorney, Agent, or Firm* — Smith, Gambrell & Russell, LLP

(57) ABSTRACT

A diffraction grating device includes a substrate with a primary surface having a plurality of grating areas that are periodically arranged with a constant period in a predetermined axis direction, the grating area including a first area and a second area, a diffraction grating structure providing a chirped grating whose pitch monotonically changes along the predetermined axis direction, a core layer that is optically coupled with the diffraction grating structure with a coupling coefficient, a plurality of grating portions including the diffraction grating structure and the core layer, the grating portion including a first portion and second portion that are arranged on the first area and the second area, respectively, of the primary surface and a perturbing layer disposed at the first portion or the second portion. The perturbing layer changes the coupling coefficient between the diffraction grating structure and core layer. A periodical change in the coupling coefficient is formed along the core layer, and this change in the coupling coefficient affects the light propagating through the core layer in the direction of the predetermined axis.

12 Claims, 13 Drawing Sheets

DIFFRACTION GRATING DEVICE, LASER DIODE, AND WAVELENGTH TUNABLE FILTER

BACKGROUND OF THE INVENTION

1. Field of the Invention

The present invention relates to a diffraction grating device, a laser diode, and a wavelength tunable filter.

2. Description of the Related Art

Non-Patent Document 1 (Optical integrated device, Kohroh Kobayashi, Kyoritsu Shuppan Co., Ltd., 1999, p. 116) describes a wavelength tunable laser including a pair of non-uniform gratings. The non-uniform gratings have a plurality of peaks of reflectivity in a reflection spectrum thereof. In addition, a gain region (active layer) is provided between the pair of non-uniform gratings. In this wavelength tunable laser, the lasing wavelength is changed by injecting a current to each of the non-uniform gratings. Furthermore, by using the vernier effect, the lasing wavelength is significantly changed by injecting a small current into each of the non-uniform gratings. A sampled grating and a super-structure grating are described as the structure of the non-uniform grating.

SUMMARY OF THE INVENTION

When the non-uniform gratings of the wavelength tunable laser described in Non-Patent Document 1 are sampled gratings, a reflection spectrum thereof has maximum values of the reflectivity at a plurality of wavelengths. The wavelength at which the reflectivity becomes the maximum is referred to as "peak wavelength". The sampled grating has a large wavelength dependence of the reflectivity at the peak wavelengths. In the wavelength tunable laser having sampled gratings as the non-uniform gratings, oscillation occurs at a wavelength near the peak wavelength. And the peak wavelength is changed by injecting a current into the sampled gratings, and thus the lasing wavelength can be changed. An optical output of the wavelength tunable laser is determined by the reflectivity of the sampled gratings near the peak wavelength. The reflectivity of the sampled grating at the peak wavelength significantly depends on the wavelength. Therefore, when the lasing wavelength is changed by injecting a current into the sampled gratings, the optical output of the wavelength tunable laser significantly changes with respect to the lasing wavelength. That is, the optical output of the wavelength tunable laser described in Non-Patent Document 1 shows a significant wavelength dependence.

In the case where the non-uniform gratings of the wavelength tunable laser described in Non-Patent Document 1 are super-structure gratings, the structure of the gratings is so complicated to obtain uniform reflectivity at a plurality of peak wavelengths. Furthermore, the reproducibility of reflectivity, especially the reflectivity at the peak wavelength, is poor because of an effect of a production error.

The present invention has been made in view of the above situation. It is an object of the present invention to provide a diffraction grating device in which the wavelength dependence of the reflectivity peaks is small. It is another object of the present invention to provide a laser diode and wavelength tunable filter including the diffraction grating device.

According to an aspect of the present invention, a diffraction grating device includes (a) a substrate with a primary surface having a plurality of grating areas that are periodically arranged with a constant period in a predetermined axis direction, the grating area including a first area and a second area, (b) a diffraction grating structure providing a chirped grating whose pitch monotonically changes along the predetermined axis direction, (c) a core layer that is optically coupled with the diffraction grating structure with a coupling coefficient, (d) a plurality of grating portions including the diffraction grating structure and the core layer, the grating portion including a first portion and second portion that are arranged on the first area and the second area, respectively, of the primary surface and (e) a perturbing layer disposed at the first portion or the second portion, the perturbing layer changing the coupling coefficient between the diffraction grating structure and core layer.

According to this diffraction grating device, a diffraction grating structure including a chirped grating and a core layer are disposed on a substrate, and grating portions are arranged with a constant period in a predetermined axis direction. A perturbing layer is disposed at the first portion or the second portion in the grating portion. The coupling coefficient $\kappa_1$ of the diffraction grating structure in the first portions is different from the coupling coefficient $\kappa_2$ of the diffraction grating structure in the second portions. The coupling coefficient between the grating structure and the core layer is periodically modulated in the predetermined axis direction. Accordingly, a reflection spectrum of the diffraction grating structure has a plurality of peaks of the reflectivity. In addition, the wavelength dependence of values of these peaks of the reflectivity can be small.

In the diffraction grating device according to the present invention, the chirped grating disposed at the first portion has a coupling coefficient $\kappa_1$, and the chirped grating disposed at the second portion has a coupling coefficient $\kappa_2$. The first portion has a first length defined in the predetermined axis direction, and the second portion has a second length defined in the predetermined axis direction. The coupling coefficient $\kappa_2$ is larger than the coupling coefficient $\kappa_1$, and the first length is longer than the second length.

According to this diffraction grating device, an interval between a plurality of peaks in a reflection spectrum is defined by the period of the grating portion that is the sum of the first length of the first portion and the second length of the second portion. When the second length is shorter than the first length, the full width at half maximum of the reflection spectrum near each peak value can be decreased.

In the diffraction grating device according to the present invention, the diffraction grating structure is disposed on the substrate, the core layer is disposed on the diffraction grating structure, and the perturbing layer is disposed between the core layer and the diffraction grating structure.

According to this diffraction grating device, the core layer is optically coupled with the diffraction grating structure. Since the perturbing layer is disposed between the core layer and the diffraction grating structure, the coupling coefficient in the second portions can be different from the coupling coefficient in the first portions because of the presence of the perturbing layer.

In the diffraction grating device according to the present invention, the core layer is disposed on the substrate, the diffraction grating structure is disposed on the core layer, and the perturbing layer is disposed between the core layer and the diffraction grating structure.

According to this diffraction grating device, the core layer is optically coupled with the diffraction grating structure. Since the perturbing layer is disposed between the core layer and the diffraction grating structure, the coupling coefficient in the second portions can be different from the coupling coefficient in the first portions because of the presence of the perturbing layer.

Furthermore, in the diffraction grating device according to the present invention, the core layer is disposed on the substrate, the diffraction grating structure is disposed on the core layer, and the perturbing layer is disposed between the core layer and the substrate. According to this diffraction grating device, a modulation can be added to an optical coupling between the core layer and the diffraction grating structure by the presence of the perturbing layer provided on the first area or the second area in the grating area of the primary surface.

In the diffraction grating device according to the present invention, the core layer, the diffraction grating structure and the perturbing layer are made of a III-V compound semiconductor. This diffraction grating device can be prepared as a semiconductor device.

In the diffraction grating device according to the present invention, the core layer, the diffraction grating structure and the perturbing layer are made of a silicon oxide. This diffraction grating device can be prepared by utilizing the refractive index of the silicon oxide.

The diffraction grating device according to the present invention may further include an electrode disposed on the diffraction grating structure. According to this diffraction grating device, a current or a voltage can be applied from the electrode or heating can be performed using the electrode.

According to another aspect of the present invention, a diffraction grating device includes (a) a substrate with a primary surface having a plurality of grating areas that are periodically arranged with a constant period in a predetermined axis direction, the grating area including a first area and a second area, (b) a diffraction grating structure providing a chirped grating whose pitch monotonically changes along the predetermined axis direction, (c) a core layer that is optically coupled with the diffraction grating structure with a coupling coefficient, (d) a plurality of grating portions including the diffraction grating structure and the core layer, the grating portion including a first portion and second portion that are arranged on the first area and the second area, respectively, of the primary surface and (e) a semiconductor mesa including the grating portions and extending in the predetermined axis direction, the semiconductor mesa having a first mesa width of the mesa at the first portion, and a second mesa width of the mesa at the second portion. The second mesa width is larger than the first mesa width. According to this diffraction grating device, the core layer is optically coupled with the diffraction grating structure. The coupling coefficient in the second portions can be different from the coupling coefficient in the first portions because of the difference in the mesa width between the first portions and second portions.

According to another aspect of the present invention, a diffraction grating device includes (a) a substrate with a primary surface having a plurality of grating areas that are periodically arranged with a constant period in a predetermined axis direction, the grating area including a first area and a second area, (b) a diffraction grating structure providing a chirped grating whose pitch monotonically changes along the predetermined axis direction, the diffraction grating structure including a first layer, a second layer, and a junction between the first layer and the second layer, (c) a core layer that is optically coupled with the diffraction grating structure with a coupling coefficient, (d) a plurality of grating portions including the diffraction grating structure and the core layer, the grating portion including a first portion and second portion that are arranged on the first area and the second area, respectively, of the primary surface. The first portions and the second portions have distances between the junction and the core layer, the distance in the first portions and the second portions is continuously changed in the predetermined axis direction, and the distance is discontinuously changed at boundaries between the first areas and the second areas.

According to this diffraction grating device, a discontinuous change in the distance between the core layer and the junction is periodically located in the predetermined axis direction. Accordingly, the coupling coefficient in the second portions can be different from the coupling coefficient in the first portions.

The above-described diffraction grating device can be used in a device such as a laser diode or a wavelength tunable filter.

A laser diode according to another aspect of the present invention includes (a) a substrate with a primary surface having a plurality of grating areas that are periodically arranged with a constant period in a predetermined axis direction, the grating area including a first area and a second area, (b) a first optical reflector, (c) a second optical reflector, (d) a laser cavity formed by the first optical reflector and the second optical reflector, the first optical reflector including a diffraction grating device disposed on the substrate and (e) an optical gain region having an optical gain generated by injection of carriers, the optical gain region disposed in the laser cavity. In the laser diode, the first optical reflector includes the above-described diffraction grating device disposed on the substrate.

According to this laser diode, in a reflection spectrum of the diffraction grating device, the wavelength dependence of peak values of the reflectivity is small. Consequently, the wavelength dependence of an optical output of the wavelength tunable laser diode is small.

In the laser diode according to the present invention, the second optical reflector may include the above-described diffraction grating device.

According to this laser diode, the optical gain region is disposed between the two diffraction grating devices. Therefore, the lasing wavelength can be changed by means of the vernier effect using the first optical reflector and the second optical reflector. In this change in the lasing wavelength, the wavelength dependence of an optical output of the wavelength tunable laser diode is small.

The laser diode according to the present invention may further include a third optical reflector for the laser cavity and an optical coupler that optically couples the first and second optical reflectors with the optical gain region. The third optical reflector may include an end facet of the laser diode, and each of the first optical reflector and the second optical reflector may include the above-described diffraction grating device.

According to this laser diode, each of the first optical reflector and the second optical reflector is coupled with the optical gain region via the optical coupler. Accordingly, the lasing wavelength can be changed by means of the vernier effect using the first optical reflector and the second optical reflector. In this change in the lasing wavelength, the wavelength dependence of an optical output of the wavelength tunable laser diode is small.

In the laser diode according to the present invention, the second optical reflector may include an end facet of the laser diode. The laser diode may further include a ring resonator that is disposed in the laser cavity on the substrate. The ring resonator and the optical gain region may constitute a semiconductor light source, and, in the semiconductor light source, the ring resonator may be optically coupled with the optical gain region in series.

According to this laser diode, the ring resonator has a transmission spectrum similar to that of a Fabry-Perot resonator, and in addition, in a reflection spectrum of the diffraction grating device, the wavelength dependence of peak values of the reflectivity is small. Therefore, the lasing wavelength can be changed by means of the vernier effect using the diffraction grating device and the ring resonator. In this change in the lasing wavelength, the wavelength dependence of an optical output of the wavelength tunable laser diode is small.

The laser diode according to the present invention may further include a phase control region disposed in the laser cavity, the phase control region including an optical waveguide and an electrode disposed on the optical waveguide.

According to this laser diode, phase matching during wavelength tuning can be easily performed using the phase control region.

A wavelength tunable filter according to another aspect of the present invention includes (a) a substrate with a primary surface having a plurality of grating areas that are periodically arranged with a constant period in a predetermined axis direction, the grating area including a first area and a second area, (b) a diffraction grating device disposed on the substrate, (c) an electrode disposed on a diffraction grating device, (d) a facet receiving an input light and outputting an optical light from the diffraction grating device. The diffraction grating device may include the above-described diffraction grating device.

According to this wavelength tunable filter, a reflection spectrum of the diffraction grating device has a plurality of reflectivity peaks, and the wavelength dependence of values of these reflectivity peaks is small. Consequently, the wavelength dependence of the reflectivity of the wavelength tunable filter can be decreased.

The wavelength tunable filter of the present invention may further include an optical element that is optically coupled with the diffraction grating device in series. The optical element may be either a ring resonator or a Fabry-Perot etalon.

According to this wavelength tunable filter, a wavelength tunable filter having a reflectivity with small wavelength dependence can be provided by using the vernier effect caused by a combination of the ring resonator or the Fabry-Perot etalon and the diffraction grating device.

The diffraction grating device, laser diode, and wavelength tunable filter described above can be formed on, for example, a semiconductor substrate. Alternatively, these devices can be formed on an optical waveguide on a quartz substrate or a silicon (Si) substrate. In addition, these devices can be optically coupled with a semiconductor device including a waveguide having an optical gain. When the vernier effect is used, the reflection spectrum can be controlled by a change in the refractive index due to a temperature change.

The above object, another object, features, and advantages of the present invention will more easily become apparent from the following detailed description of preferred embodiments of the present invention with reference to the attached drawings.

DESCRIPTION OF THE PREFERRED EMBODIMENTS

Figure 1A:
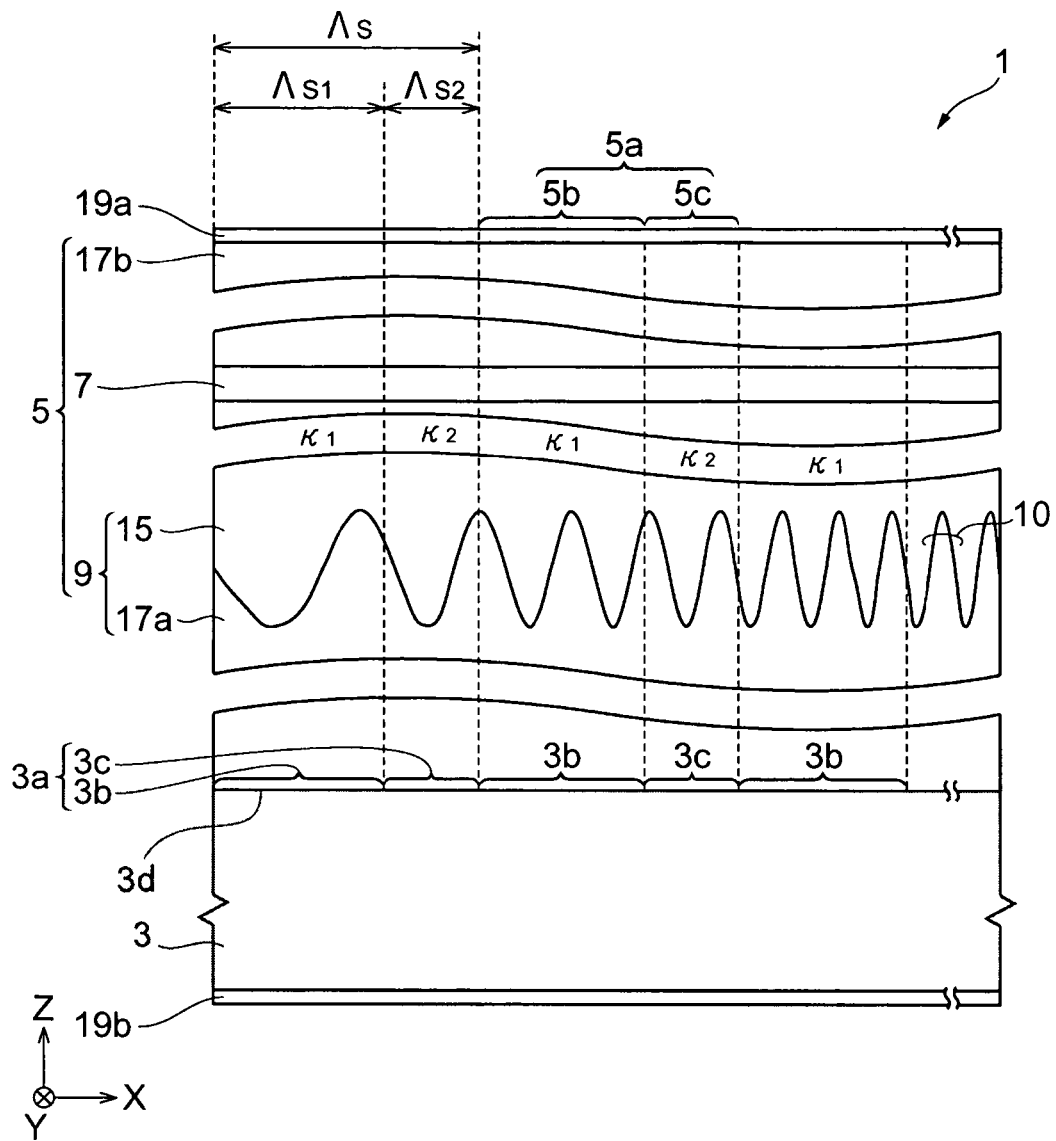
FIG. 1A is a cross-sectional view that schematically shows the structure of a diffraction grating device according to an embodiment.

The finding of the present invention can be easily understood by considering a detailed description below with reference to the attached drawings shown as exemplifications. Diffraction grating devices, laser diodes, and wavelength tunable filters according to embodiments of the present invention will now be described with reference to the attached drawings. The same components are assigned the same reference numerals for each possible case.

Figure 1B:
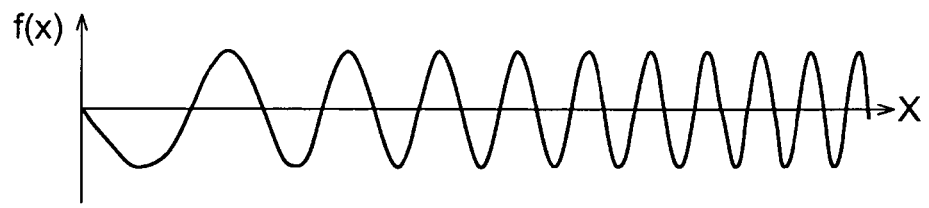
FIG. 1B is a graph showing an example of a function f(X) representing a period and shape of a chirped grating 10 with respect to an X-axis.

FIG. 1A is a schematic view showing the structure of a diffraction grating device according to an embodiment. Referring to FIG. 1A, a rectangular coordinate system S is shown. A diffraction grating device 1 includes a substrate 3 and a stacked structure 5 with a plurality of layers. The substrate 3 has a primary surface 3d. The primary surface 3d includes a plurality of grating areas 3a with first areas 3b and second areas 3c. The grating areas 3a with a constant period Λs are periodically arranged in a direction of a predetermined axis (e.g., X-axis). The stacked structure 5 includes a plurality of grating portions 5a with first portions 5b and second portions 5c. The grating portions 5a are disposed on the grating areas 3a of the primary surface 3d. Each of the first portions 5b is disposed on the corresponding first area 3b of the primary surface 3d, and each of the second portions 5c is disposed on the corresponding second area 3c thereof. The stacked structure 5 includes a core layer 7 and a diffraction grating structure 9 (hereinafter, referred to as a "grating structure 9"). The core layer 7 is disposed between a first cladding region 17a and a second cladding region 17b. The first cladding region 17a, the core layer 7, and the second cladding region 17b constitute an optical waveguide structure. That is, the core layer 7 has a higher refractive index than the refractive indices of the first cladding region 17a and the second cladding region 17b. As shown in FIG. 1B, the function f(X) represents a period and shape of a chirped grating 10 with respect to a predetermined coordinate axis (e.g., X-axis). The core layer 7 of the optical waveguide structure is optically coupled with the grating structure 9. A coupling coefficient $\kappa_1$ of the grating structure 9 in the first portions 5b is different from a coupling coefficient $\kappa_2$ of the grating structure 9 in the second portions 5c.

According to this diffraction grating device 1, the grating portions are periodically arranged with a constant period $\Lambda s$ in the predetermined axis (e.g., X-axis) direction. The coupling coefficient $\kappa_1$ of the chirped grating at the first portion is different from the coupling coefficient $\kappa_2$ of the chirped grating at the second portion. Therefore, the coupling coefficient of the grating structure 9 is modulated with a constant period $\Lambda s$ in the predetermined axis (e.g., X-axis) direction. A spectrum of the chirped grating 10 has an almost constant reflectivity within a wide-wavelength-band, and does not contain peak value of the reflectivity. Furthermore, the periodical peaks of the reflectivity are caused by the periodical modulation of the coupling coefficient of the grating structure 9. Accordingly, within the band, the optical spectrum of the grating structure 9 has a plurality of peaks with an almost constant peak value of reflectivity.

The grating portion 5a includes the first portions 5b and the second portions 5c. The grating portion 5a has a length $\Lambda_s$. The first portion 5b has a length $\Lambda_{s1}$ and the second portion 5c has a length $\Lambda_{s2}$. There is a relationship $\Lambda_s = \Lambda_{s1} + \Lambda_{s2}$ among these lengths. The grating portions 5a are periodically arranged with a period of $\Lambda_s$ in the predetermined coordinate axis (e.g., X-axis). The function f(X) has a plurality of peaks. The interval between adjacent peaks of the function f(X) monotonically changes. Preferably, the interval between adjacent peaks of the function f(X) monotonically decreases.

Figure 2:
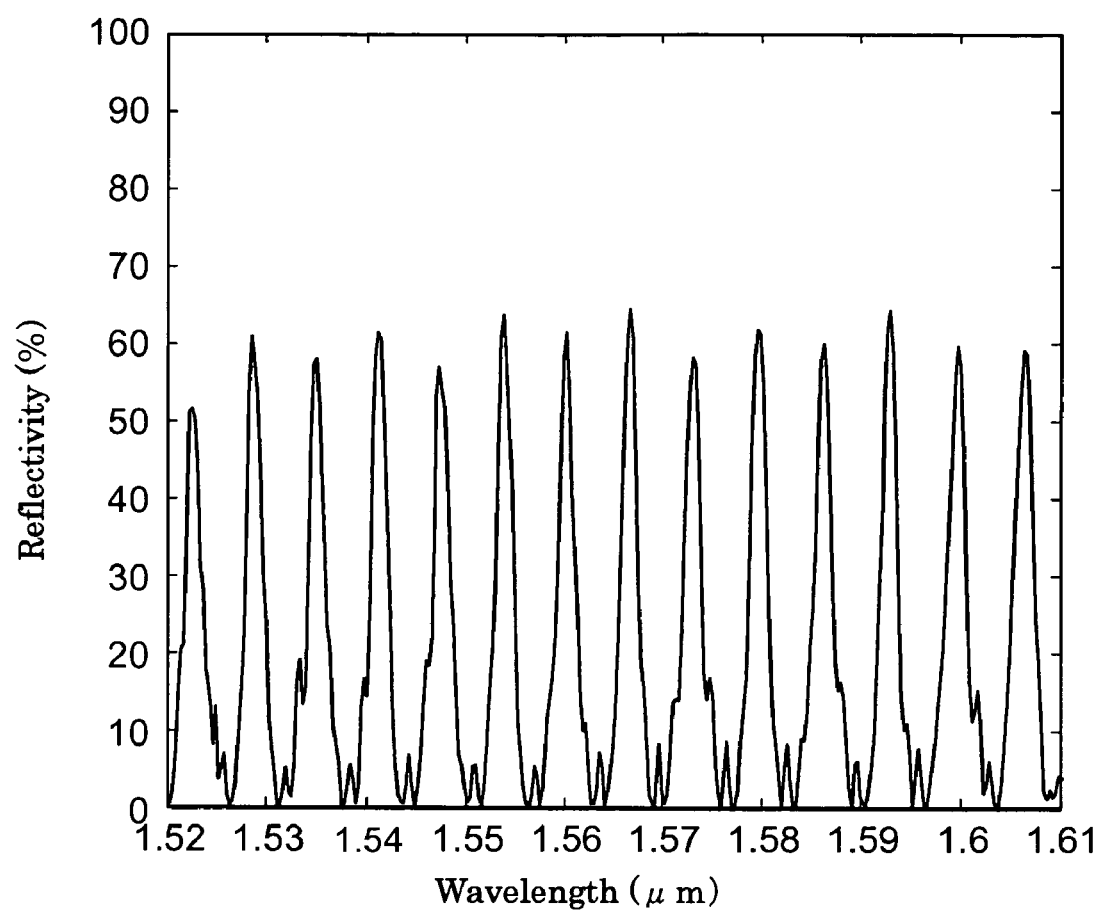
FIG. 2 is a graph showing a reflection spectrum provided by a simulation.

The diffraction grating device 1 shows, for example, an optical spectrum shown in FIG. 2. FIG. 2 is a graph showing an optical spectrum provided by a simulation. According to this diffraction grating device 1, the grating portions 5a of the grating structure 9 are periodically arranged with a period of $\Lambda_s$, and the period and shape of a chirped grating 10 is defined by the function f(X). Accordingly, the optical spectrum of the grating structure 9 has a plurality of peak values of the reflectivity shown in FIG. 2, and the wavelength dependence of the peak values of the reflectivity is small.

In the simulation model for the results shown in FIG. 2, the period $\Lambda_s$ is 50 µm, the length $\Lambda_{s1}$ is 7 µm, and the grating structure includes ten grating portions 5a. That is, the grating structure includes ten periods of the grating portions 5a. The period of the chirped grating 10 is changed in the range of 0.2047 to 0.2224 µm. In the grating portion 5a, the grating is optically coupled with forward propagating waves or backward propagating waves with a coupling coefficient K. The coupling coefficient $\kappa_1$ of the first portion 5b is 200 cm$^{-1}$, and the coupling coefficient $\kappa_2$ of the second portion 5c is 40 cm$^{-1}$. Referring to FIG. 2, a reflection spectrum in a 1.55 µm-wavelength band is shown. In this reflection spectrum, a plurality of peak values of the reflectivity are present, and the wavelength dependence of the peak values of the reflectivity is small.

The period $\Lambda s$ defines the interval of a plurality of peak values of the reflectivity in the reflection spectrum. The ratio of the length $\Lambda_{s1}$ to the length $\Lambda_{s2}$ relates to the spectral width of each reflectivity peak. In order to decrease the spectral width, the relationship $\Lambda_{s2} > \Lambda_{s1}$ is preferably satisfied. That is, the length of a region having a large coupling coefficient of the grating is preferably shorter than the length of another region having a small coupling coefficient.

In an example of the diffraction grating device, when the chirped grating has an entire length L, the period $\Lambda_s$ is a length in the range of about L/100 to L/5. For example, the period $\Lambda_s$ is in the range of about 10 to 100 µm. The length $\Lambda_{s2}$ is, for example, in the range of about 5 to 50 µm.

Figure 3:
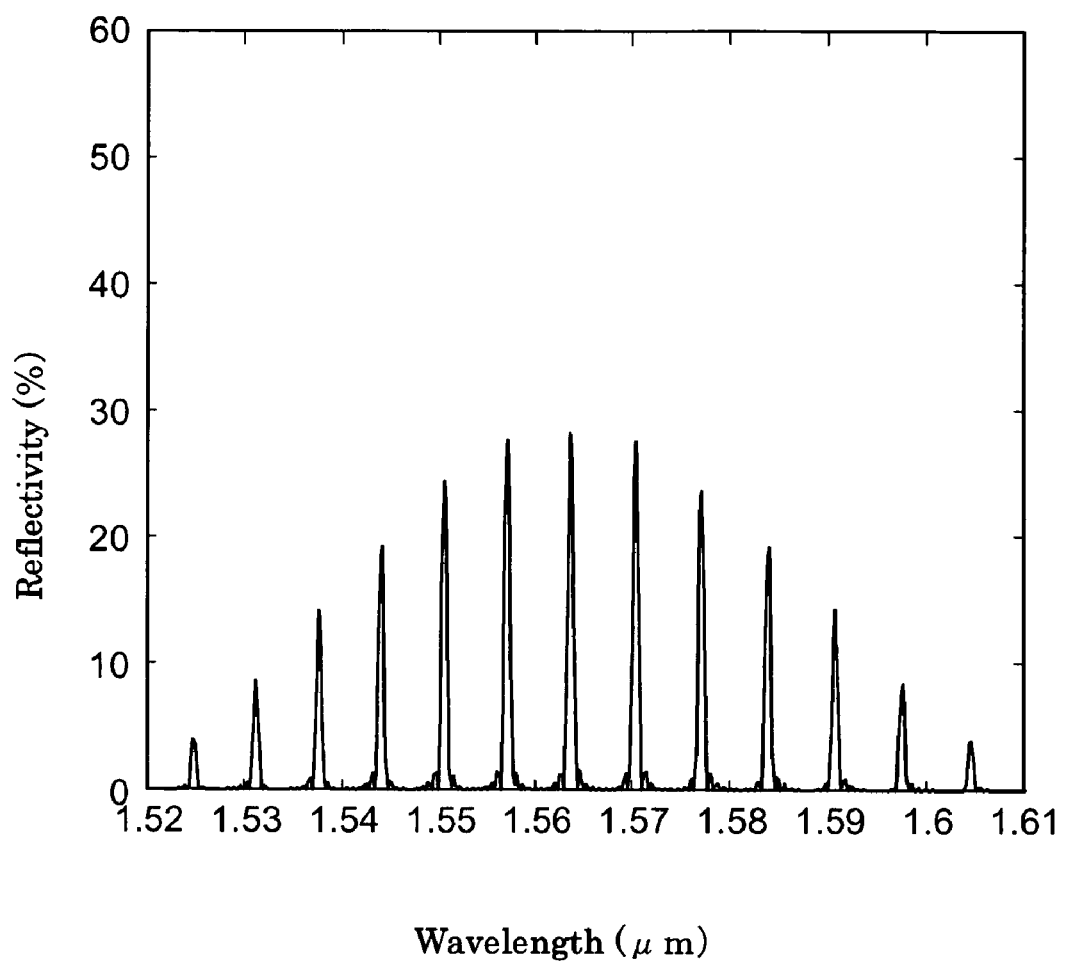
FIG. 3 is a graph showing an example of a reflection spectrum of a sampled grating.

FIG. 3 shows an example of a reflection spectrum of a sampled grating. Comparing FIG. 2 with FIG. 3, it is understood that the diffraction grating device 1 has an optical spectrum in which the wavelength dependence of peak values of the reflectivity is small. The grating structure 9 includes the grating portions 5a that are periodically arranged with a period $\Lambda s$, and includes the chirped grating whose period is defined by the function f(X) over the entire grating structure 9. Accordingly, the optical spectrum shown in FIG. 2 is different from the optical spectrum shown in FIG. 3. FIG. 3 shows an example of a reflection spectrum of a sampled grating or a super-structure grating.

Referring to FIG. 1A again, the diffraction grating device 1 can further include the first cladding region 17a and the second cladding region 17b. The core layer 7 is provided between the first cladding region 17a and the second cladding region 17b. The core layer 7, the first cladding region 17a and the second cladding region 17b form an optical waveguide structure. The average refractive index of the core layer 7 is larger than the refractive index of the first cladding region 17a and that of the second cladding region 17b, and light propagating through the optical waveguide is confined in the core layer 7. In this embodiment, a chirped grating 10 with periodic projections and recesses is provided at the interface between the first cladding region 17a and a waveguide region 15. The refractive index of the waveguide region 15 is different from the refractive index of the first cladding region 17a.

According to this diffraction grating device 1, the grating portions 5a with the first portions 5b and the second portions 5c are periodically arranged with a period $\Lambda s$ along a predetermined axis. The first portions 5b and the second portions 5c have different coupling coefficients ($\kappa$). In the grating portions 5a, the first portions 5b and the second portions 5c are optically coupled with the core layer 7. However, the optical coupling between the first portions 5b and the core layer 7 is different from the optical coupling between the second portions 5b and the core layer 7. In the drawing, the grating portions 5a are provided between the core layer 7 and the substrate 3. However, the present embodiment is not limited to this structure.

In a preferred embodiment of the diffraction grating device, the core layer 7, the first cladding region 17a, and the second cladding region 17b of the optical waveguide structure are made of III-V compound semiconductors, respectively. In this case, the diffraction grating device 1 of this embodiment is prepared by using a semiconductor process for producing a semiconductor device. The diffraction grating device 1 is integrated with other semiconductor devices, thereby providing an optical integrated semiconductor device. For example, the core layer 7 is made of GaInAsP, the first cladding region 17a and the second cladding region 17b are made of InP, and the waveguide region 15 for the grating structure 9 is made of GaInAsP. The bandgap energy of the GaInAsP of the core layer 7 is preferably equal to or less than the bandgap energy of the GaInAsP of the waveguide region 15. The core layer 7, the first cladding region 17a, and the second cladding region 17b of the optical waveguide structure are composed of electrically conductive semiconductor layers deposited on the electrically conductive semiconductor substrate 3 such as an electrically conductive InP substrate. The substrate 3 may include the first cladding region 17a if necessary.

In another preferred embodiment of the diffraction grating device, the core layer 7, the first cladding region 17a, and the second cladding region 17b of the optical waveguide structure are made of silicon oxides ($SiO_2$), respectively. In this case, the diffraction grating device 1 of this embodiment is prepared by using a process for producing a planar optical waveguide based on silicon oxide material. In addition, the diffraction grating device 1 is integrated with optical waveguide devices, thereby providing an optical integrated device. For example, the core layer 7 is made of Ge-doped $SiO_2$, the first cladding region 17a and the second cladding region 17b are made of undoped $SiO_2$, and the waveguide region 15 is made of Ge-doped $SiO_2$. The Ge concentration of the core layer 7 is preferably equal to or higher than the Ge concentration of the waveguide region 15. The core layer 7, the first cladding region 17a, and the second cladding region 17b of the optical waveguide structure are composed of silicon oxide layers deposited on the substrate 3 such as a Si substrate or a $SiO_2$ substrate.

In another embodiment, the material of the core layer 7 may be the same as the material of the waveguide region 15. In this structure, the core layer 7 is provided so as to be adjacent to the first cladding region 17a. A chirped grating 10 in the grating portion 5a of the grating structure 9 is provided by the surface shape (the shape of junction) of the first cladding region 17a. The chirped grating 10 is formed from the junction of the first cladding region 17a and the core layer 7. This structure is advantageous in that a large coupling coefficient $\kappa$ of the grating can be realized.

The diffraction grating device 1 further includes an electrode 19a disposed on the grating structure 9. The refractive index of the grating structure 9 can be adjusted by injecting the current from the electrode 19a, for example.

In the case where the diffraction grating device 1 is formed of semiconductor materials, the semiconductors can be formed of electrically conductive semiconductor layers. By supplying a current from one of an electrode 19b provided on the reverse face of the electrically conductive substrate 3 and the electrode 19a to the other electrode 19a or 19b, carriers are injected into the grating structure 9, thereby changing the refractive index of the grating structure 9. The refractive index of the grating structure 9 is decreased by injecting a current. Alternatively, the refractive index of the grating structure 9 can be changed by applying an electric field from the electrode 19a.

In the case where the diffraction grating device 1 is formed of silicon oxides using a process of producing a planar optical waveguide, the refractive index of the grating structure 9 can be changed by utilizing heat generated by applying electrical signals to the electrode 19a. That is, the electrode 19a is provided so as to be used as a heater.

Figure 4:
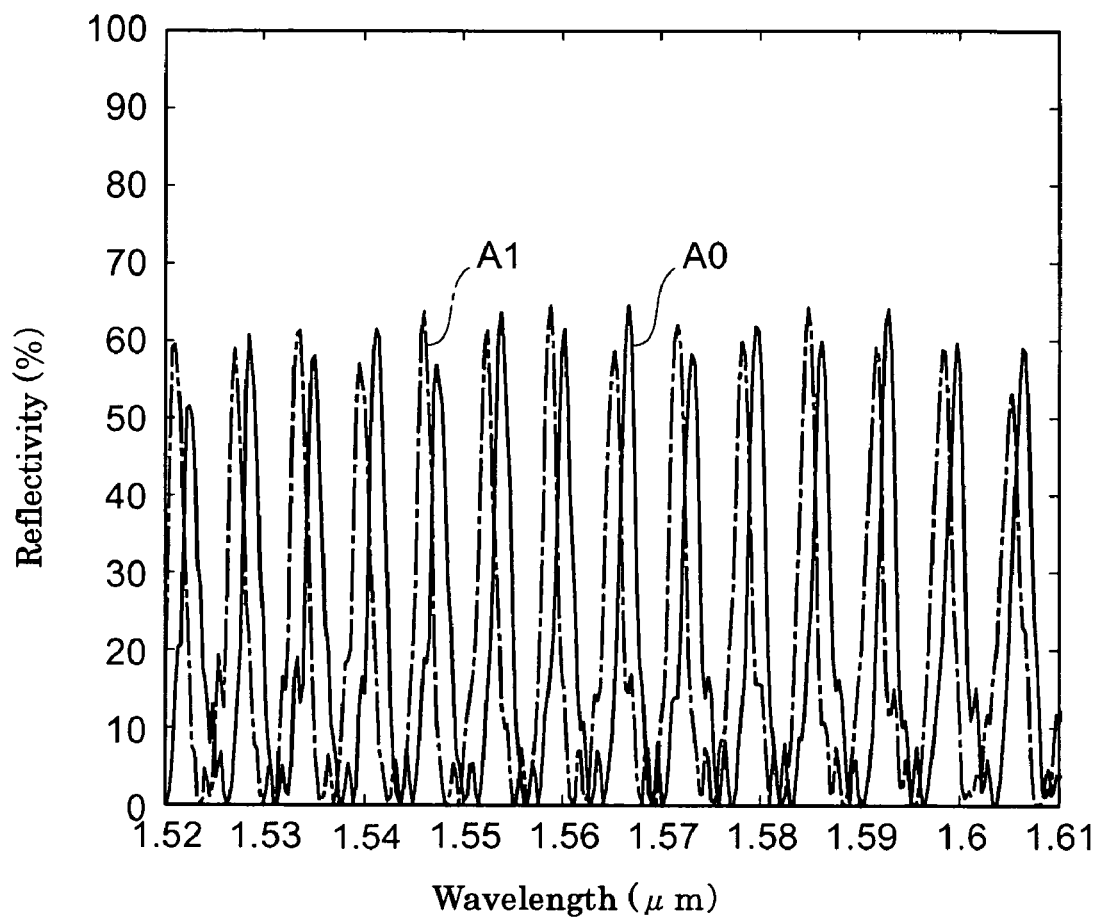
FIG. 4 is a graph showing an example of an adjustment of an optical spectrum using an electrode.

FIG. 4 is a graph showing an example of an adjustment of an optical spectrum using an electrode. Characteristic line A1 shows a reflection spectrum at a current of 5 mA injected from the electrode 19a, and characteristic line A0 shows a reflection spectrum at no electrical signals from the electrode 19a. By applying electrical signals, the positions of peak wavelengths of the optical spectrum can be adjusted.

As described above, the grating structure 9 includes the grating portions 5a that are periodically arranged with a period of $\Lambda s$, and includes the chirped grating 10 whose period is defined by the function f(X) over the entire grating structure 9. Accordingly, in the reflection spectrum of the diffraction grating device 1, wavelength dependence of peak values of the reflectivity is small, and the positions of peak wavelengths of the optical spectrum can be electrically adjusted.

In the grating structure 9 of the diffraction grating device 1, a first layer is composed of the first cladding region 17a, and a second layer is composed of the waveguide region 15. The first cladding region 17a and the waveguide region 15 have a first refractive index n1 and a second refractive index n2, respectively, different from each other. The first cladding region 17a and the waveguide region 15 form a junction for a grating. The stacked structure 5 includes a perturbing layer that is provided on the first areas 3b or the second areas 3c. The perturbing layer is optically coupled with the grating structure 9 and the core layer 7. The perturbing layer has a third refractive index n3 different from the refractive index of the core layer 7 and the refractive index of the waveguide region 15. An Optical confinement in the waveguide structure changes at the first portions 5b and the second portion 5c. This change in the optical confinement affects the coupling coefficient between the grating structure 9 and the core layer 7. Accordingly, the coupling coefficient $\kappa_1$ of the grating structure 9 in the first portions 5b can be different from the coupling coefficient $\kappa_2$ of the grating structure 9 in the second portions 5c.

Examples of the structures in the above-described embodiment will now be described with reference to FIG. 5 to FIG. 9B.

Figure 5:
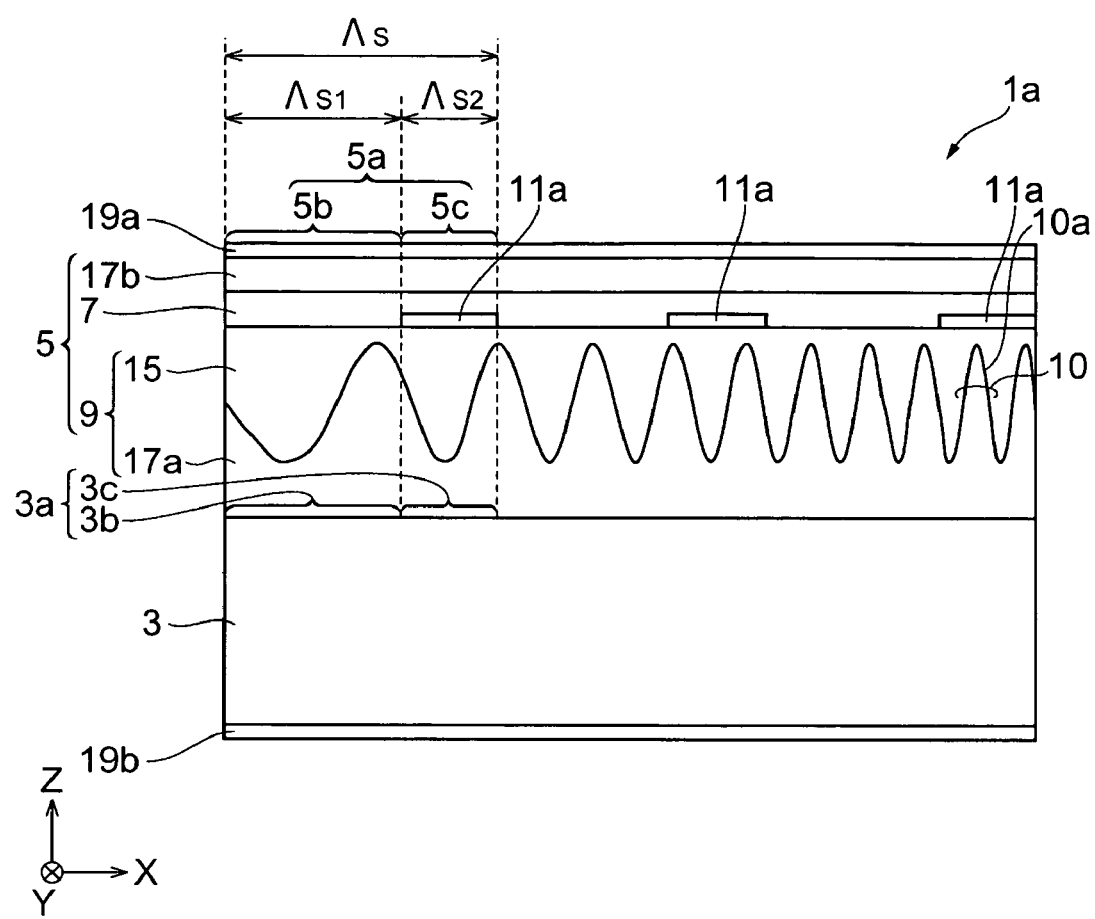
FIG. 5 is a cross-sectional view showing an example of the structure of a diffraction grating device.

FIG. 5 is a cross-sectional view showing an example of the structure of a diffraction grating device. In a diffraction grating device 1a, a grating structure 9 is provided between a core layer 7 and a substrate 3. In the grating structure 9, the first layer described above is composed of a first cladding region 17a, and the second layer described above is composed of a waveguide region 15. The first cladding region 17a and the waveguide region 15 have a first refractive index nil and a second refractive index n2, respectively, different from each other. The first cladding region 17a and the waveguide region 15 form a junction 10a for a chirped grating. A stacked structure 5 includes a perturbing layer 11a, and the perturbing layer 11a is disposed between the core layer 7 and the grating structure 9. The perturbing layer 11a is provided on the second area 3c of the primary surface. The perturbing layer 11a is optically coupled with the grating structure 9 and the core layer 7. The perturbing layer 11a has a third refractive index n3 different from the refractive index of the waveguide region 15. For example, the third refractive index n3 is smaller than the refractive index of the waveguide region 15. According to this diffraction grating device 1a, the stacked structure 5 includes the perturbing layer 11a provided on the second areas 3c. In second portions 5c, the perturbing layer 11a is disposed between the core layer 7 and the first cladding region 17a. On the other hand, in first portions 5b, the core layer 7 is adjacent to the waveguide region 15 of the grating structure 9. An optical confinement in the direction perpendicular to the primary surface of the substrate (e.g., Z-axis direction) is changed at the first portions 5b and the second portion 5c. This change in the optical confinement affects the coupling coefficient between the grating structure 9 and the core layer 7 at the first portions 5b and the second portion 5c. Accordingly, the coupling coefficient $\kappa_1$ of the grating structure 9 in the first portions 5b can be different from the coupling coefficient $\kappa_2$ of the grating structure 9 in the second portions 5c. A periodical change in the refractive index and the coupling coefficient, the change being formed by the refractive index of the perturbing layer 11a and the refractive index of the core layer 7, is formed along the core layer 7 in the light propagating direction. This change in the refractive index and the coupling coefficient affects the light propagating through the core layer 7 in the direction of the predetermined axis (e.g., X-axis). Since the perturbing layer 11a is disposed near the core layer 7, a large difference between the coupling coefficient $\kappa_1$ of the grating structure 9 in the first portions 5b and the coupling coefficient $\kappa_2$ of the grating structure 9 in the second portions 5c can be realized. Therefore, a wavelength band of a reflection spectrum can be widened. A plurality of peaks have substantially the same reflectivity in the wavelength band of a reflection spectrum.

Figure 6:
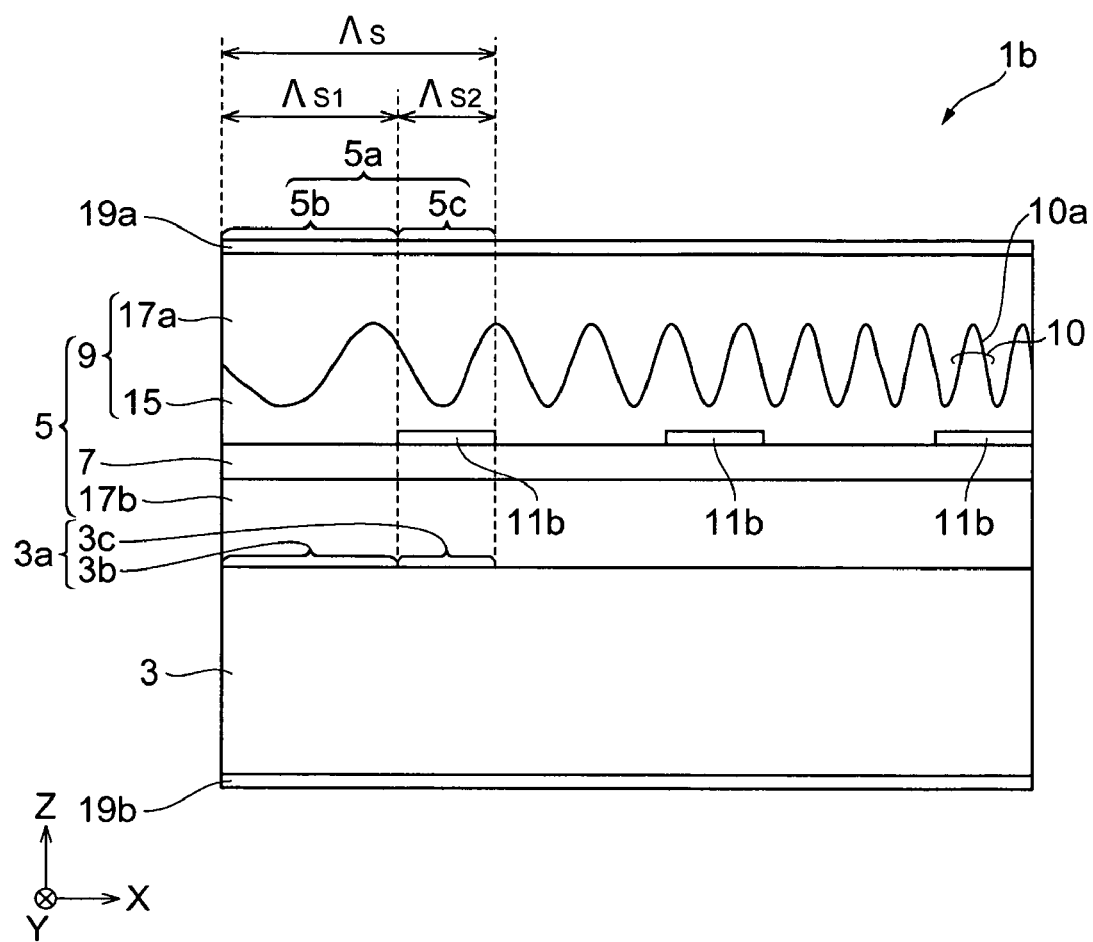
FIG. 6 is a cross-sectional view showing another example of the structure of a diffraction grating device.

FIG. 6 is a cross-sectional view showing an example of the structure of a diffraction grating device. In a diffraction grating device 1b, a core layer 7 is provided between a grating structure 9 and a substrate 3. In the grating structure 9, the first layer is composed of a first cladding region 17a, and the second layer is composed of a waveguide region 15. The first cladding region 17a and the waveguide region 15 form a junction 10a for a grating. A stacked structure 5 includes a perturbing layer 11b, and the perturbing layer 11b is disposed between the core layer 7 and the grating structure 9. The perturbing layer 11b is provided on the second area 3c. The perturbing layer 11b is optically coupled with the grating structure 9 and the core layer 7. The perturbing layer 11b has a third refractive index n3 different from the refractive index of the waveguide region 15. For example, the third refractive index n3 is smaller than the refractive index of the waveguide region 15. According to this diffraction grating device 1b, the stacked structure 5 includes the perturbing layer 11b provided on the second areas 3c. In second portions 5c, the perturbing layer 11b is disposed between the core layer 7 and the first cladding region 17a. On the other hand, in first portions 5b, the core layer 7 is adjacent to the waveguide region 15 of the grating structure 9. An optical confinement in the direction perpendicular to the primary surface of the substrate (e.g., Z-axis direction) is changed at the first portions 5b and the second portion 5c. This change in the optical confinement affects the coupling coefficient between the grating structure 9 and the core layer 7 at the first portions 5b and the second portion 5c. Accordingly, the coupling coefficient $\kappa_1$ of the grating structure 9 in the first portions 5b can be different from the coupling coefficient $\kappa_2$ of the grating structure 9 in the second portions 5c. A periodical change in the refractive index and the coupling coefficient, the change being formed by the refractive index of the perturbing layer 11b and the refractive index of the waveguide region 15, is formed along the core layer 7 in a direction of a predetermined axis (e.g., X-axis), that is, the light propagation direction. This change in the refractive index and the coupling coefficient affects the light propagating through the core layer 7 in the direction of the predetermined axis. The perturbing layer 11b and the grating structure 9 are formed after growing an active layer, and thus the good flatness of the core layer is obtained and an optical loss of the waveguide structure can be decreased.

Figure 7:
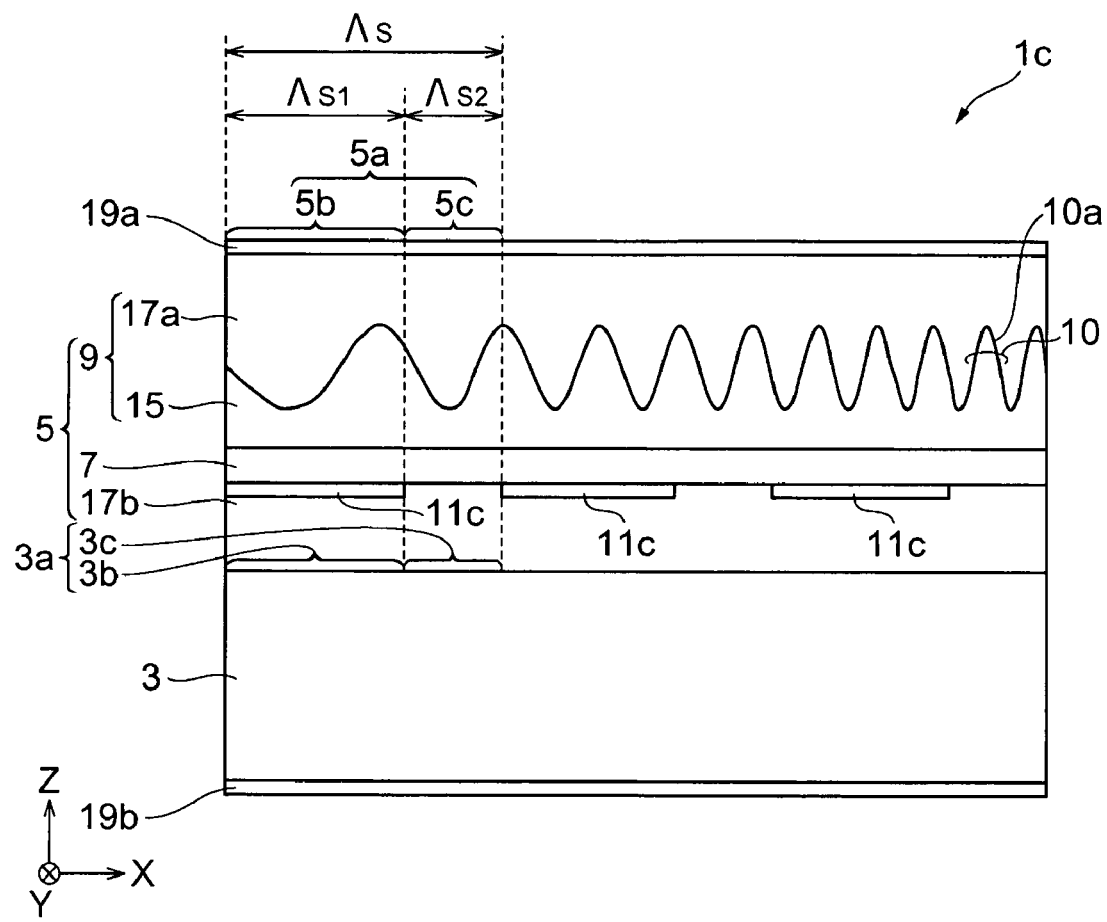
FIG. 7 is a cross-sectional view showing another example of the structure of a diffraction grating device.

FIG. 7 is a cross-sectional view showing an example of the structure of a diffraction grating device. In a diffraction grating device 1c, a core layer 7 is provided between a grating structure 9 and a substrate 3. In the grating structure 9, the first layer is composed of a first cladding region 17a, and the second layer is composed of a waveguide region 15. The first cladding region 17a and the waveguide region 15 form a junction 10a for a grating. A stacked structure 5 includes a perturbing layer 11c, and the perturbing layer 11c is disposed between the core layer 7 and a substrate 3. In this embodiment, the perturbing layer 11c in first portions 5b is disposed between the core layer 7 and a second cladding region 17b. The perturbing layer 11c is provided on the first area 3b. The perturbing layer 11c is optically coupled with the grating structure 9 and the core layer 7. The perturbing layer 11c has a third refractive index n3 different from the refractive index of a second cladding region 17b. For example, the third refractive index n3 is larger than the refractive index of the second cladding region 17b. According to this diffraction grating device 1c, the stacked structure 5 includes the perturbing layer 11c provided on the first areas 3b. In first portions 5b, the perturbing layer 11c is disposed between the core layer 7 and the second cladding region 17b. On the other hand, in second portions 5c, the core layer 7 is adjacent to the second cladding region 17b. An optical confinement in the direction perpendicular to the primary surface of the substrate (e.g., Z-axis direction) is changed at the first portions 5b and the second portion 5c. This change in the optical confinement affects the coupling coefficient between the grating structure 9 and the core layer 7 at the first portions 5b and the second portion 5c. Accordingly, the coupling coefficient $\kappa_1$ of the grating structure 9 in the first portions 5b can be different from the coupling coefficient $\kappa_2$ of the grating structure 9 in the second portions 5c. A periodical change in the refractive index and the coupling coefficient, the change being formed by the refractive index of the perturbing layer 11c and the refractive index of the second cladding region 17b, is formed along the core layer 7 in a direction of a predetermined axis (e.g., X-axis), that is, a light propagating direction. This change in the refractive index and the coupling coefficient affects the light propagating through the core layer 7 in the direction of the predetermined axis. The perturbing layer 11c is disposed opposite the grating structure 9 with the core layer 7 therebetween. Therefore, a periodical change in the refractive index, the change being formed by the refractive index of the perturbing layer 11c and the refractive index of the second cladding region 17b, can be generated without decreasing the coupling coefficients of the grating structure 9.

Figure 8:
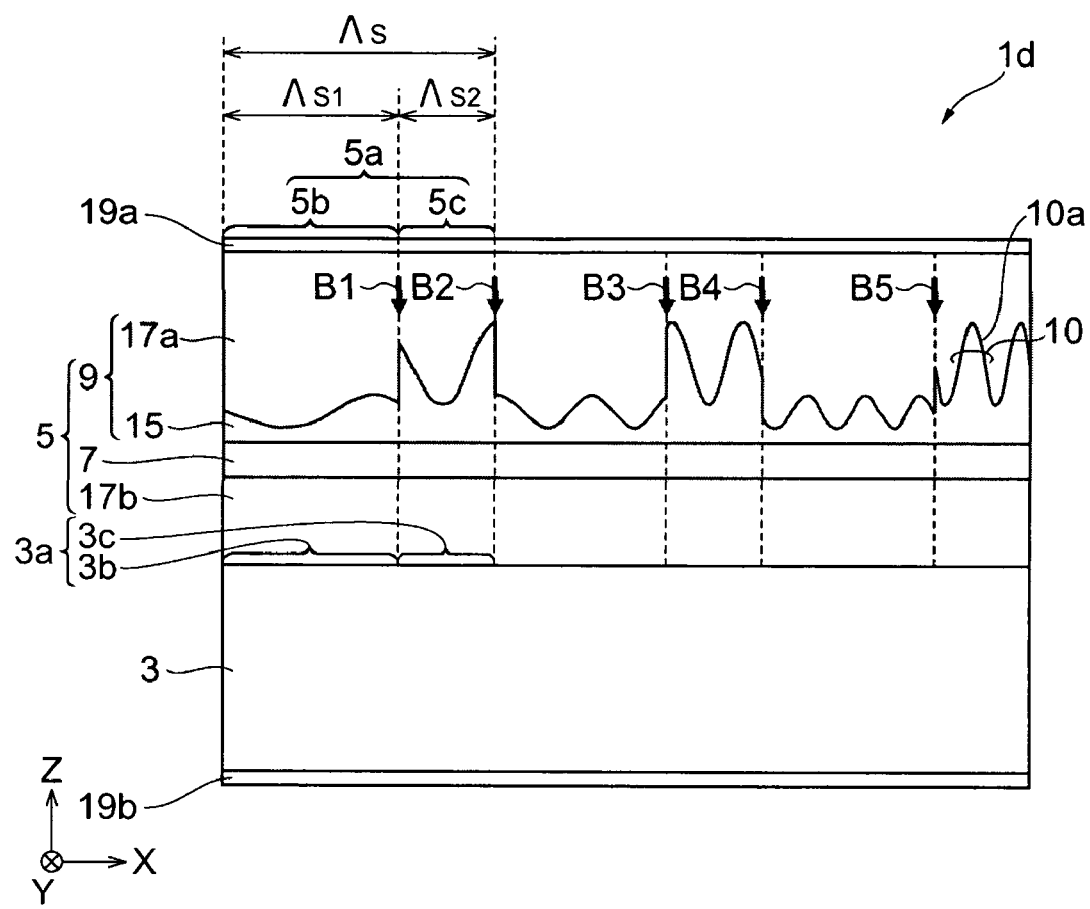
FIG. 8 is a cross-sectional view showing another example of the structure of a diffraction grating device.

FIG. 8 is a cross-sectional view showing an example of the structure of a diffraction grating device. In a diffraction grating device 1d, a core layer 7 is provided between a grating structure 9 and a substrate 3. In the grating structure 9, the first layer is composed of a first cladding region 17a, and the second layer is composed of a waveguide region 15. The first cladding region 17a and the waveguide region 15 form a junction 10a for a grating. The period of the grating structure 9 is provided by discontinuously changing the distance between the junction 10a and the core layer 7 on a predetermined axis. This distance is continuously changed in each of first portions 5b, and the distance is continuously changed in each of second portions 5c. However, the distance is discontinuously changed at boundaries B1, B2, B3, B4, and B5 between the first areas 3b and the second areas 3c. The boundaries B1, B3, B5, are periodically arranged, and the boundaries B2, B4, . . . are periodically arranged. For example, the thickness of the waveguide region 15 in the first portions 5b is obtained by subtracting a predetermined thickness from the thickness of the waveguide region 15 in the second portions 5c. Although the film thickness is discontinuously changed, the period of the chirped grating 10 is defined by the chirped function f(X) described above. Therefore, the average distance between the junction 10a and the core layer 7 in the second portion 5c is larger than the average distance between the junction 10a and the core layer 7 in the first portion 5b.

According to this diffraction grating device 1d, the distance between the core layer and the junction is periodically and discontinuously changed in a direction of a predetermined axis. This change in the distance affects the optical confinement in the direction perpendicular to the primary surface of the substrate. Accordingly, this change in the distance affects the coupling coefficient between the grating structure 9 and the core layer 7. The coupling coefficient $\kappa_1$ of the grating structure 9 in the first portions 5b can be different from the coupling coefficient $\kappa_2$ of the grating structure 9 in the second portions 5c. This change in the distance also affects the refractive index of the grating structure 9. This change in the refractive index and the coupling coefficient affects the light propagating through the core layer 7 in the predetermined direction, that is, a light propagation direction. Since a large difference between the coupling coefficient $\kappa_1$ of the grating structure 9 in the first portions 5b and the coupling coefficient $\kappa_2$ of the grating structure 9 in the second portions 5c can be realized, a wavelength band of a reflection spectrum can be widened. A plurality of peaks have substantially the same reflectivity in the wavelength band of a reflection spectrum.

Figure 9A:
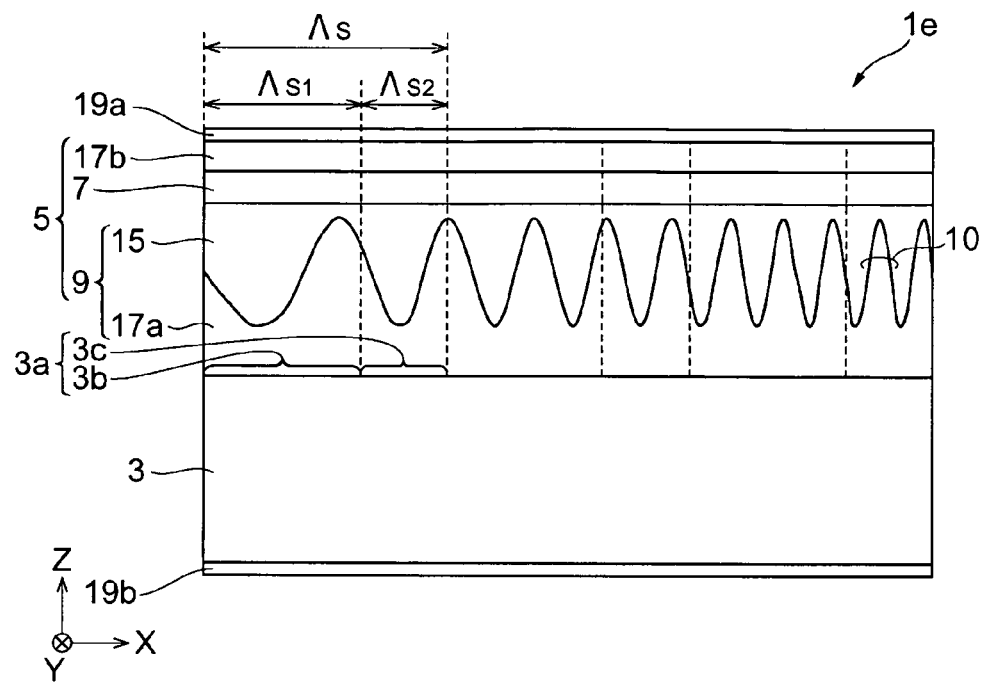
FIG. 9A is a cross-sectional view showing another example of the structure of a diffraction grating device.
Figure 9B:
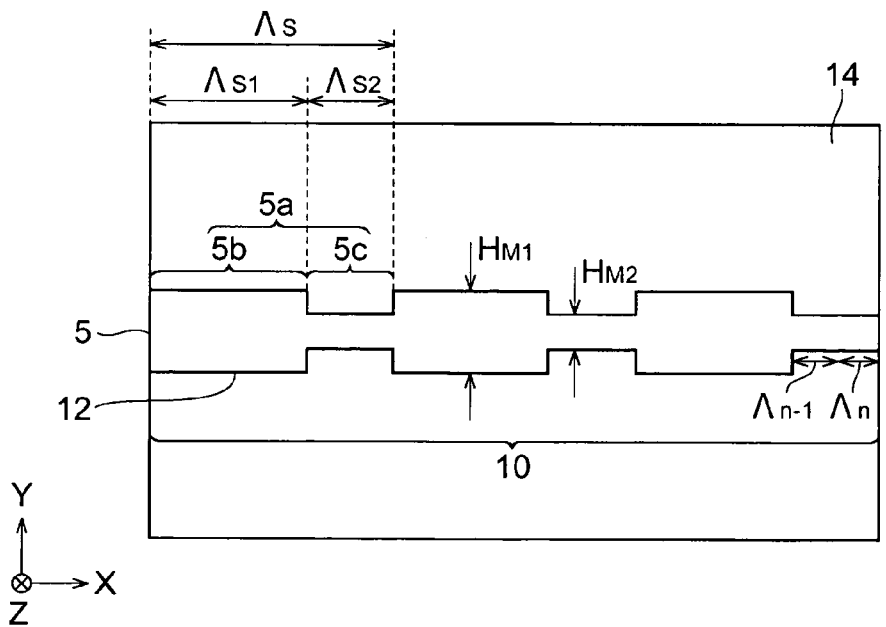
FIG. 9B is a top view of the diffraction grating device shown in FIG. 9A.

FIGS. 9A and 9B are view showing an example of the structure of a diffraction grating device. FIG. 9A is a cross-sectional view of the diffraction grating device cut along an axis (e.g., X-axis) parallel to a direction in which light propagates in an optical waveguide. FIG. 9B is a plan view of the diffraction grating device. As shown in FIG. 9A, in a diffraction grating device 1e, a grating structure 9 is provided between a core layer 7 and a substrate 3. In addition, as shown in FIG. 9B, a stacked structure 5 has a semiconductor mesa 12 extending in a direction of a predetermined axis. The semiconductor mesa 12 is buried in a burying region 14. In this embodiment, a mesa width $H_{M1}$ (for example, 1.2 μm) of first portions 5b of the stacked structure 5 is larger than a mesa width $H_{M2}$ (for example, 0.7 μm) of second portions 5c thereof. According to this diffraction grating device 1e, the core layer 7 and the grating structure 9 are optically coupled with each other. The difference in the mesa width affects the optical confinement in the direction parallel to a end facet of the diffraction grating device (e.g., Y-axis direction). This change in the optical confinement affects the coupling coefficient between the grating structure 9 and the core layer 7, and refractive index of the waveguide structure. Accordingly, the coupling coefficient $\kappa_1$ of the grating structure 9 in the first portions 5b can be different from the coupling coefficient $\kappa_2$ of the grating structure 9 in the second portions 5c. A periodical change in the refractive index and the coupling coefficient is formed along the core layer 7 in the light propagating direction. This change in the refractive index and the coupling coefficient affects the light propagating through the core layer 7 in the light propagation direction. Since a large difference between the coupling coefficient $\kappa_1$ in the first portions 5b and the coupling coefficient $\kappa_2$ in the second portions 5c can be realized, a wavelength band of a reflection spectrum can be widened. A plurality of peaks have substantially the same reflectivity in the wavelength band of a reflection spectrum.

Next, laser diodes and wavelength tunable filters including the diffraction grating device will be described.

Figure 10A:
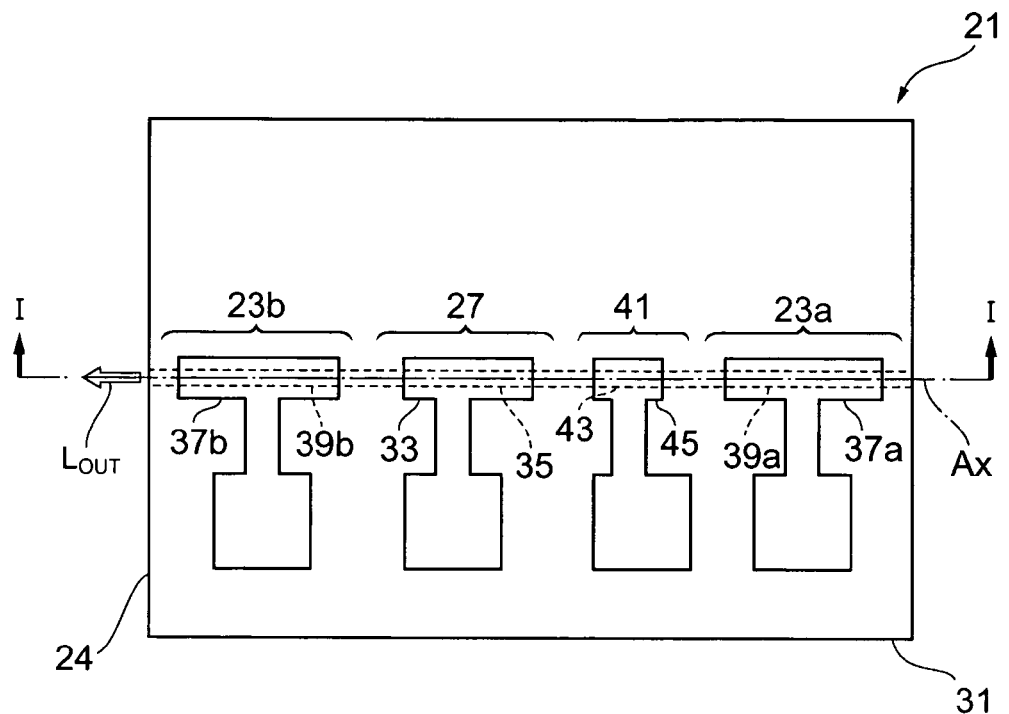
FIG. 10A is a top view showing the structure of a laser diode according to an embodiment.

FIG. 10A is a view showing the structure of a laser diode according to an embodiment. A laser diode 21 includes a first optical reflector 23a, a second optical reflector 23b, and an optical gain region 27. The first optical reflector 23a and the second optical reflector 23b are provided so as to constitute a laser cavity. This laser cavity is provided on a substrate 31. The optical gain region 27 is provided in the laser cavity on the substrate 31, and has an optical gain when carriers are injected from an electrode 33. Because of this optical gain, an optical waveguide 35 included in the optical gain region 27 constitutes a waveguide having an optical gain. The first optical reflector 23a includes the same structure as the above-described diffraction grating device 1.

The diffraction grating device 1 has a characteristic comb-like reflection spectrum. More specifically, the reflection spectrum of the diffraction grating device 1 includes a plurality of reflection peak values, and the peak values are substantially the same. That is, the diffraction grating device 1 has an optical spectrum in which the wavelength dependence of the peak values of the reflectivity is small. Accordingly, because of this characteristic optical spectrum of the diffraction grating device 1, the wavelength dependence of an optical output of the laser diode 21 is small.

The second optical reflector 23b may include a grating having a comb-like reflection spectrum with a plurality of reflection peaks. For example, a sampled grating or a super-structure grating may be used for this grating. Instead of the grating, a facet mirror of the laser diode 21 is also used as the second optical reflector 23b. The first optical reflector 23a includes an electrode 37a and an optical waveguide 39a. The optical waveguide 39a includes the core layer 7 and the grating structure 9 shown in FIG. 1A. Therefore, the wavelength dependence of the peak values of the reflectivity in a reflection spectrum is small in the first optical reflector 23a. The wavelength can be changed by means of the vernier effect using the optical reflectors 23a and 23b.

The second optical reflector 23b may have the same structure as the diffraction grating device 1. The second optical reflector 23b includes an electrode 37b and an optical waveguide 39b. The optical waveguide 39b includes the core layer 7 and the grating structure 9 shown in FIG. 1A. Therefore, also in the second optical reflector 23b, the wavelength dependence of the peak values of the reflectivity in a reflection spectrum is small.

In this laser diode 21, each of the first optical reflector 23a and the second optical reflector 23b includes the diffraction grating device 1, and the optical gain region 27 is disposed between the first optical reflector 23a and the second optical reflector 23b. Therefore, the lasing wavelength can be changed by means of the vernier effect using the optical reflectors 23a and 23b. In this wavelength tuning, the wavelength dependence of the optical output of the wavelength tunable laser diode 21 is small.

The laser diode 21 may further include a phase control region 41 provided in the laser cavity. The phase control region 41 includes an optical waveguide 43 provided on the substrate 31 and an electrode 45 that applies signals for controlling the phase of the optical waveguide 43. Phase matching during wavelength tuning can be easily performed using the phase control region 41, and a fine tuning of the wavelength can be realized.

In the laser diode 21, the first optical reflector 23a, the second optical reflector 23b, the optical gain region 27, and the phase control region 41 are formed on the single substrate 31. Components (such as semiconductor stacked structures, optical waveguides, and electrodes) of the laser diode 21 are formed by combining processes for producing a semiconductor device such as a crystal growth process, an etching process and a formation process of electrodes.

Figure 10B:
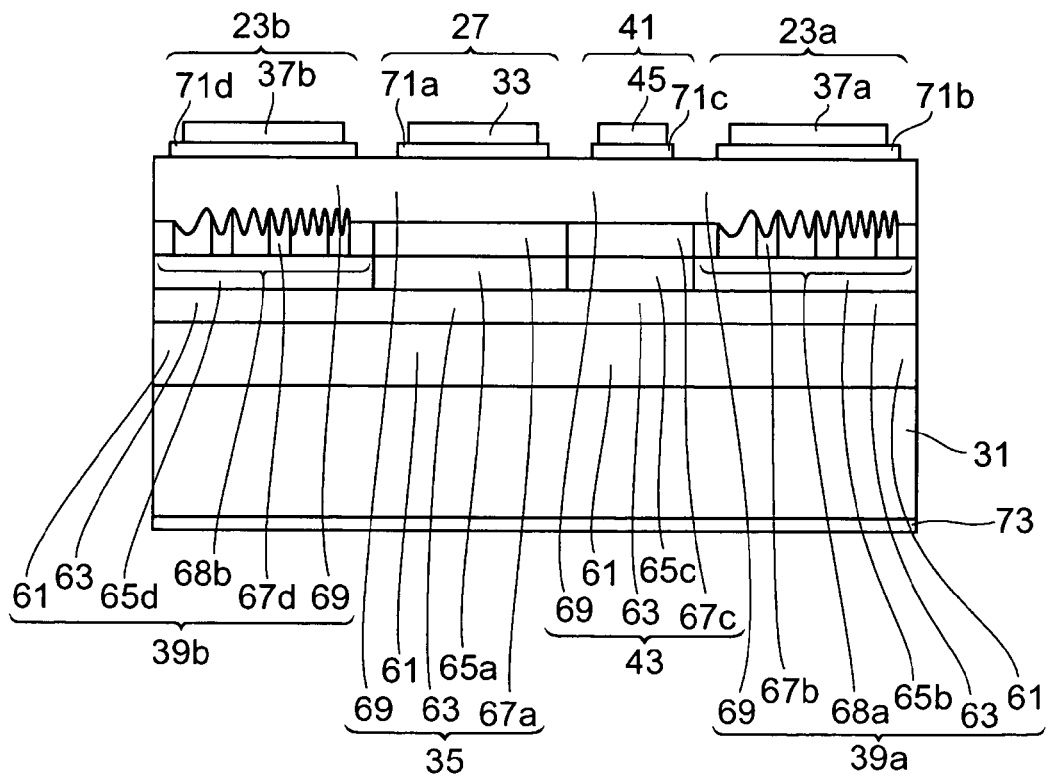
FIG. 10B is a schematic longitudinal cross-sectional view of the laser diode taken along line I-I in FIG. 10A.

FIG. 10B is a schematic longitudinal cross-sectional view of the laser diode taken along line I-I in FIG. 10A. The optical gain region 27 includes an n-type cladding layer 61, an optical guiding layer 63, an active layer 65a including a quantum well structure, an optical guiding layer 67a, a p-type cladding layer 69, and a contact layer 71a, all of which are formed on the substrate 31 in that order. The optical gain region 27 generates light by carrier injection. The electrode 33 is provided on the contact layer 71a in the optical gain region 27. The first optical reflector 23a includes the n-type cladding layer 61, the optical guiding layer 63, a core layer 65b, a grating structure 68a, an optical guiding layer 67b, the p-type cladding layer 69, and a contact layer 71b, all of which are formed on the substrate 31 in that order. The electrode 37a is provided on the contact layer 71b in the first optical reflector 23a. The grating structure 68a includes a periodic structure provided on a surface of the optical guiding layer 67b. The phase control region 41 includes the n-type cladding layer 61, the optical guiding layer 63, a core layer 65c, an optical guiding layer 67c, the p-type cladding layer 69, and a contact layer 71c, all of which are formed on the substrate 31 in that order. The electrode 45 is provided on the contact layer 71c in the phase control region 41. The second optical reflector 23b includes the n-type cladding layer 61, the optical guiding layer 63, a core layer 65d, a grating structure 68b, an optical guiding layer 67d, the p-type cladding layer 69, and a contact layer 71d, all of which are formed on the substrate 31 in that order. The electrode 37b is provided on the contact layer 71d in the second optical reflector 23b. The grating structure 68b includes a periodic structure provided on a surface of the optical guiding layer 67d. A common electrode 73 is provided on the reverse face of the substrate 31.

A period of a grating portion of the grating structure 68b is different from a period of a grating portion of the grating structure 68a. Accordingly, for example, at the same ambient temperature, a free spectral range (FSR) obtained by the grating structure 68b is different from an FSR obtained by the grating structure 68a. In addition, the reflectivity in the grating structure 68b is different from the reflectivity in the grating structure 68a. In order to output a large laser beam $L_{out}$, the reflectivity in the grating structure 68b is smaller than the reflectivity in the grating structure 68a.

Optical confinement in the vertical direction is performed by the cladding layers 61 and 69. Optical confinement in the horizontal direction is performed by a stripe-shaped waveguide structure and a buried layer burying the waveguide structure. For example, the active layer 65a in the optical gain region 27 has a GaInAsP/GaInAsP quantum well structure having a gain in a 1.25 to 1.65-micrometer band. The optical guiding layers 63, 67a, 67b, 67c, and 67d are made of, for example, a GaInAsP semiconductor having a bandgap wavelength shorter than the bandgap wavelength of the quantum well structure. Each of the n-type cladding layer 61 and the p-type cladding layer 69 is made of an InP semiconductor. Each of the contact layers 71a, 71b, 71c, and 71d is composed of a highly doped GaInAs layer. Semi-insulating InP can be used for the buried layer. The wavelength can be changed over a wide wavelength range by injecting a small current by means of the vernier effect using the optical reflectors 23a and 23b. The end facet of the laser diode includes, for example, an anti-reflection film, and a laser beam $L_{out}$ is output from the end facet of the laser diode 21.

Figure 11:
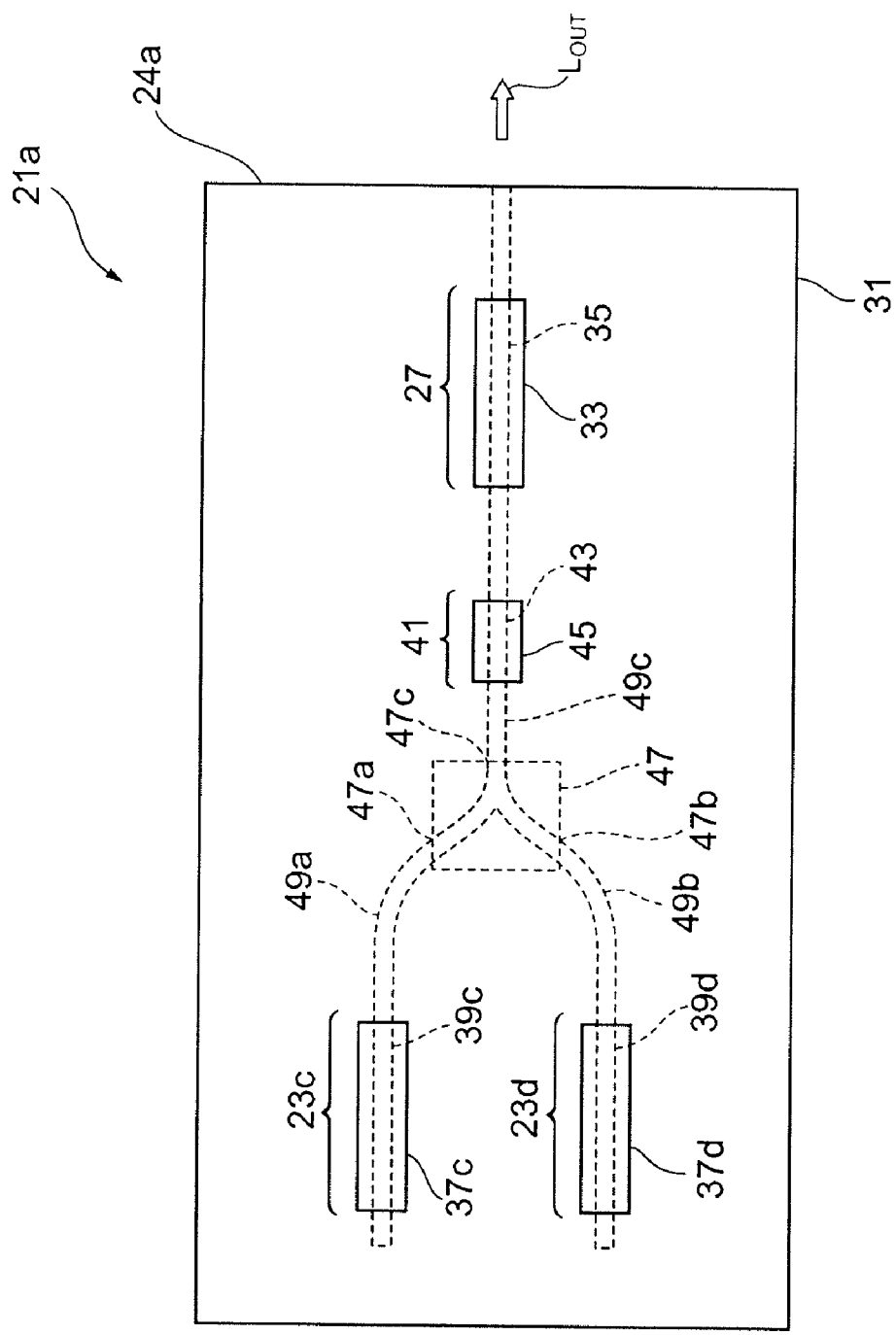
FIG. 11 is a top view showing the structure of a laser diode according to an embodiment.

FIG. 11 is a view showing the structure of a laser diode according to an embodiment. A laser diode 21a includes a first optical reflector 23c, a second optical reflector 23d, and a third optical reflector 24a, an optical gain region 27, and an optical coupling region 47. Each of the first optical reflector 23c and the second optical reflector 23d includes the above-described diffraction grating device 1. A period of a grating portion of the first optical reflector 23c is different from a period of a grating portion of the second optical reflector 23d. For example, the first optical reflector 23c and the second optical reflector 23d may include semiconductor layer structures similar to the first optical reflector 23a and the second optical reflector 23b, respectively, in the laser diode 21 in FIG. 10A and FIG. 10B. The first optical reflector 23c, the second optical reflector 23d, and the third optical reflector 24a are provided on a substrate so as to constitute a laser cavity. The third optical reflector 24a includes an end facet of the laser diode 21a, and the end facet includes an antireflection film. A dielectric multilayer having a desired reflectivity in the range of, for example, 1% to 30% is provided on the end facet as an antireflection film. The optical coupling region 47 optically couples each of the first optical reflector 23c and the second optical reflector 23d with the optical gain region 27. For example, a multi-mode interferometer (MMI) coupler is used as the optical coupling region 47.

According to this laser diode 21a, each of the first optical reflector 23c and the second optical reflector 23d is coupled with the optical gain region 27 by the optical coupling region 47. Therefore, the lasing wavelength can be changed by means of the vernier effect using the optical reflectors 23c and 23d. In this change in the lasing wavelength, the wavelength dependence of an optical output of the wavelength tunable laser diode is small. The first optical reflector 23c is optically coupled with a port 47a of the optical coupling region 47 via an optical waveguide 49a. The second optical reflector 23d is optically coupled with a port 47b of the optical coupling region 47 via an optical waveguide 49b. The optical gain region 27 is optically coupled with a port 47c of the optical coupling region 47 via a phase control region 41 and an optical waveguide 49c. The laser cavity is formed between an optical reflector formed by the optical reflector 23c and the optical reflector 23d, and the optical reflector 24a. A laser beam $L_{out}$ having a wavelength selected on the basis of the vernier effect is provided from the end facet 24a of the laser diode 21a.

Figure 12:
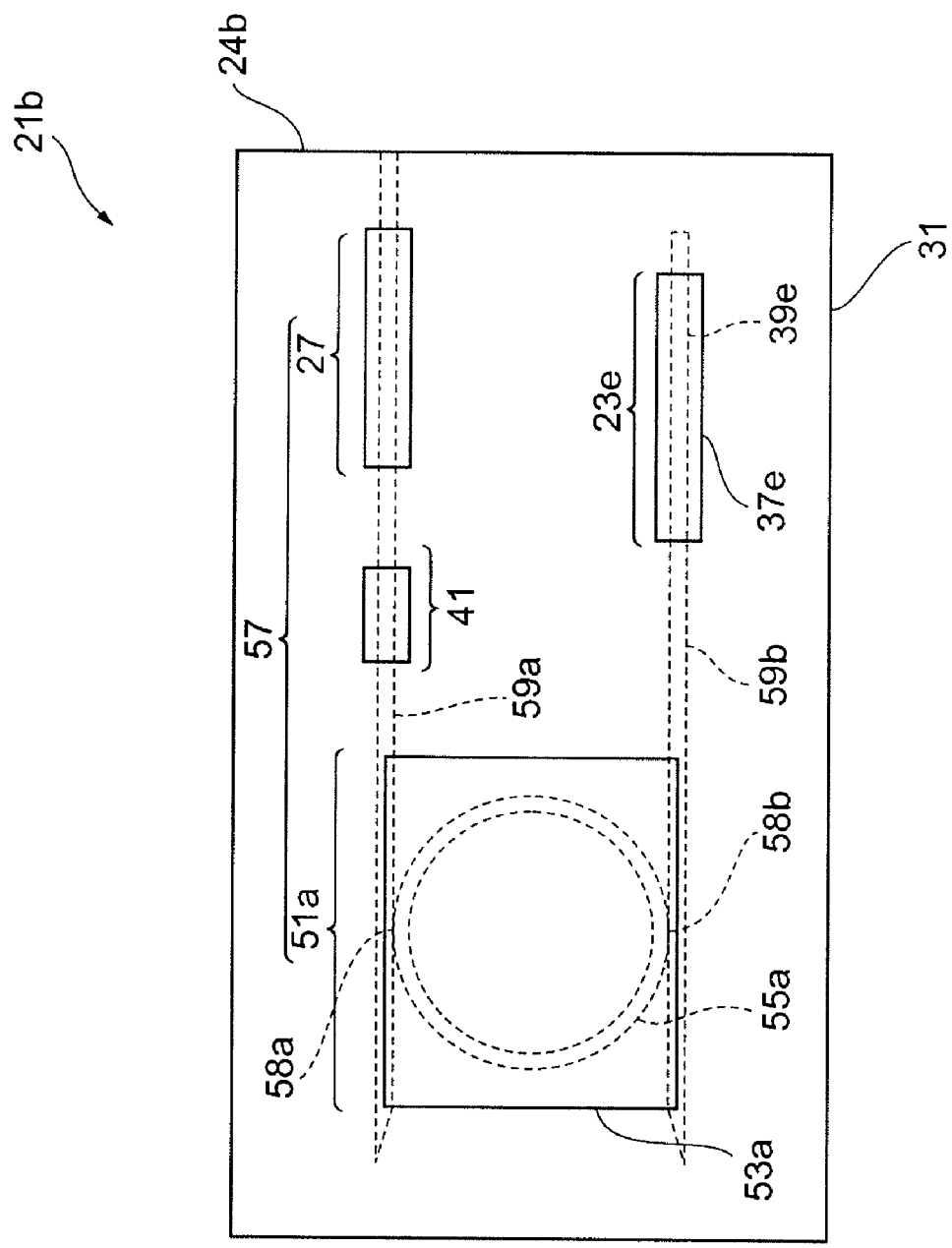
FIG. 12 is a top view showing the structure of a laser diode according to an embodiment.

FIG. 12 is a view showing the structure of a laser diode according to an embodiment. A laser diode 21b includes an optical reflector 23e, another optical reflector 24b, an optical gain region 27, and a ring resonator 51a. The optical reflector 23e includes the above-described diffraction grating device 1. The diffraction grating device 1 has a period of reflection-peak wavelengths different from an FSR of the ring resonator 51a. For example, the optical reflector 23e may include a semiconductor layer structure similar to the optical reflector 23a in the laser diode 21. The optical reflector 23e and the optical reflector 24b constitute a laser cavity. The optical reflector 24b includes an end facet of the laser diode 21b. A reflection film having a predetermined reflectivity, for example, a dielectric multilayer is provided on the end facet. The laser diode 21b is provided on a substrate 31.

The ring resonator 51a is provided in the laser cavity, and disposed on the substrate 31. The ring resonator 51a includes a closed optical waveguide 53a and an electrode 55a provided on the optical waveguide 53a. The ring resonator 51a and the optical gain region 27 constitute a semiconductor light source 57. In the semiconductor light source 57, the ring resonator 51a is optically coupled with the optical gain region 27 in series. The FSR of the ring resonator 51a is, for example, in the range of about 25 GHz to 800 GHz.

According to this laser diode 21b, the ring resonator 51a has a transmission spectrum similar to that of a Fabry-Perot resonator. An optical spectrum of the diffraction grating device 1 includes a plurality of peaks in the reflectivity, and the wavelength dependence of peak values of the reflectivity is small. Therefore, the lasing wavelength can be changed by means of the vernier effect using the diffraction grating device 1 and the ring resonator 51a. In this change in the lasing wavelength, the wavelength dependence of an optical output of the wavelength tunable laser diode 21b is small. This laser diode 21b is advantageous in that the wavelength dependence of the output of a laser beam can be further reduced during wavelength tuning by combining a comb-like transmission spectrum of the ring resonator 51a with a comb-like reflection spectrum of the optical reflector 23e.

The optical waveguide 53a of the ring resonator 51a is coupled with the optical gain region 27 via an optical coupling region 58a and an optical waveguide 59a. Furthermore, the optical waveguide 53a of the ring resonator 51a is coupled with the optical reflector 23e via an optical coupling region 58b and an optical waveguide 59b. For example, an MMI coupler can be used as the optical coupling regions 58a and 58b.

Figure 13A:
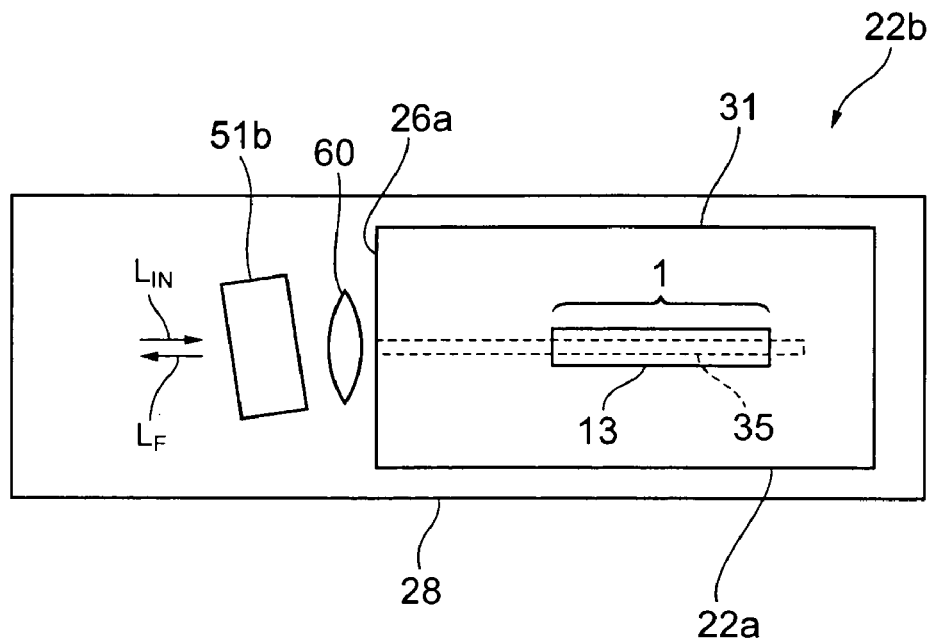
FIG. 13A is a top view showing an example of the structure of a wavelength tunable filter according to an embodiment.
Figure 13B:
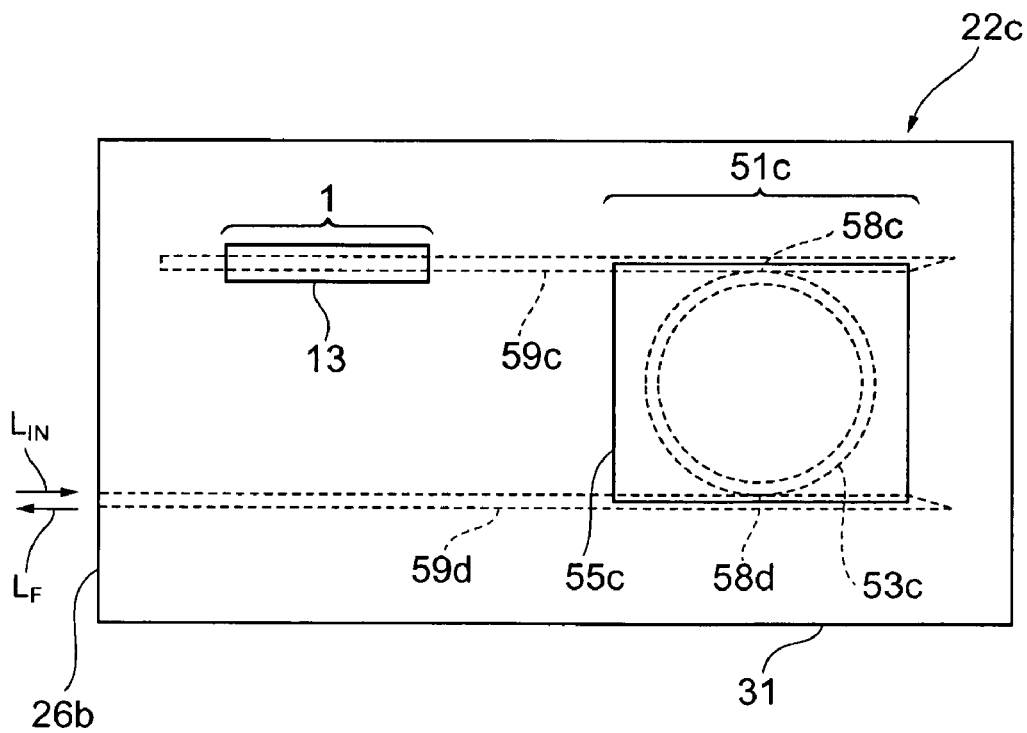
FIG. 13B is a top view showing another example of the structure of a wavelength tunable filter according to an embodiment.

FIGS. 13A and 13B are views showing the structures of wavelength tunable filters according to embodiments. A wavelength tunable filter 22a includes the above-described diffraction grating device 1 and an electrode 13. The electrode 13 is provided on a grating structure 9 of the diffraction grating device 1 and receives signals for wavelength tuning. The diffraction grating device 1 is provided on a substrate 31. According to this wavelength tunable filter 22a, an optical spectrum of the diffraction grating device 1 has a plurality of peaks in the reflectivity, and the wavelength dependence of values of the peaks in the reflectivity is small. Therefore, the wavelength dependence of the reflectivity of the wavelength tunable filter 22a can be reduced.

Each of wavelength tunable filters 22b and 22c may further include an optical element (e.g., a ring resonator 51c or a Fabry-Perot etalon 51b) that is optically coupled with the diffraction grating device 1 in series and that has a comb-like transmission spectrum similar to that of a Fabry-Perot resonator. According to these wavelength tunable filters 22b and 22c, a wavelength tunable filter having a reflectivity with small wavelength dependence can be provided by using the vernier effect caused by a combination of the ring resonator 51c or the Fabry-Perot etalon 51b and the diffraction grating device 1. The diffraction grating device 1 has a period of reflection-peak wavelengths different from FSRs of the ring resonator 51c and the Fabry-Perot etalon 51b.

The wavelength tunable filter 22b includes a lens 60 disposed between the Fabry-Perot etalon 51b and an end facet 26a of the wavelength tunable filter 22a. The end facet 26a is optically coupled with the diffraction grating device 1. In the wavelength tunable filter 22c, an optical waveguide 53c of the ring resonator 51c is coupled with the diffraction grating device 1 via an optical coupler 58c and an optical waveguide 59c. In addition, the optical waveguide 53c of the ring resonator 51c is coupled with an end facet 26b of the wavelength tunable filter 22c via an optical coupler 58d and an optical waveguide 59d. Light $L_{IN}$ before filtering is input to the end facet 26b, and light $L_F$ after filtering is output from the end facet 26b. For example, an MMI coupler can be used as the optical couplers 58c and 58d. An anti-reflection coating is provided on the end facets 26a and 26b. The wavelength tunable filters 22a, 22b, and 22c are produced by, for example, a process of producing a semiconductor device.

The incident light $L_{IN}$ including a plurality of wavelength components is incident, and among the wavelength components of the incident light, the filtered light $L_F$ of a single specific wavelength selected by the ring resonator 51c and the diffraction grating device 1 is output. An optical component having a desired wavelength is selected on the basis of the vernier effect of a peak wavelength of a comb-like transmission spectrum of the ring resonator filter and a peak wavelength of a comb-like reflection spectrum of the grating.

The wavelength tunable filters 22a, 22b, and 22c are formed on a semiconductor substrate, but the formation of the wavelength tunable filters 22a, 22b, and 22c is not limited thereto. For example, the wavelength tunable filters 22a, 22b, and 22c may be formed by using an optical waveguide provided on a quartz substrate or a silicon (Si) substrate. Furthermore, these filters 22a, 22b, and 22c can be optically coupled with a semiconductor device including a waveguide having an optical gain. A control of a reflection spectrum for using the vernier effect can be performed by changing the refractive index by changing the temperature.

The principle of the present invention has been described in the preferred embodiments with reference to the drawings. It is to be understood by those skilled in the art that the present invention can be changed in the arrangement and in the details without departing from the principle. The present invention is not limited to the specific structures disclosed in the embodiments. Accordingly, all modifications and changes derived from the scope of Claims and the scope of the spirit thereof are claimed.

What is claimed is:

1. A diffraction grating device comprising:
a substrate;
a first end facet and a second end facet opposite to the first end facet;
a diffraction grating structure providing a chirped grating whose pitch monotonically changes from the first end facet to the second end facet along a predetermined axis direction;
a core layer that is optically coupled with the diffraction grating structure with a coupling coefficient; and
a perturbing layer changing the coupling coefficient between the diffraction grating structure and the core layer, wherein
the diffraction grating device is arranged in a plurality of grating portions including a portion of the diffraction grating structure and a portion of the core layer, the grating portions including a first portion and a second portion,
the perturbing layer is disposed at the first portion or the second portion,
the grating portions are periodically arranged with a constant period in the predetermined axis direction, and
the first portion and the second portion are arranged alternately in the predetermined axis direction.

2. The diffraction grating device according to claim 1, wherein the chirped grating disposed at the first portion has a coupling coefficient $\kappa_1$,
the chirped grating disposed at the second portion has a coupling coefficient $\kappa_2$,
the first portion has a first length defined in the predetermined axis direction,
the second portion has a second length defined in the predetermined axis direction,
the coupling coefficient $\kappa_2$ is larger than the coupling coefficient $\kappa_1$, and
the first length is longer than the second length.

3. The diffraction grating device according to claim 1, wherein the diffraction grating structure is disposed on the substrate,
the core layer is disposed on the diffraction grating structure, and
the perturbing layer is disposed between the core layer and the diffraction grating structure.

4. The diffraction grating device according to claim 1, wherein the core layer is disposed on the substrate,
the diffraction grating structure is disposed on the core layer, and
the perturbing layer is disposed between the core layer and the diffraction grating structure.

5. The diffraction grating device according to claim 1, wherein the core layer is disposed on the substrate,
the diffraction grating structure is disposed on the core layer, and
the perturbing layer is disposed between the core layer and the substrate.

6. The diffraction grating device according to claim 1, wherein the core layer, the diffraction grating structure and the perturbing layer are made of a III-V compound semiconductor.

7. The diffraction grating device according to claim 1, wherein the core layer, the diffraction grating structure and the perturbing layer are made of a silicon oxide.

8. The diffraction grating device according to claim 1, further comprising an electrode disposed on the diffraction grating structure.

9. A diffraction grating device comprising:
a substrate;
a first end facet and a second end facet opposite to the first end facet;
a diffraction grating structure providing a chirped grating whose pitch monotonically changes from the first end facet to the second end facet along a predetermined axis direction;
a core layer that is optically coupled with the diffraction grating structure with a coupling coefficient; and
a semiconductor mesa, wherein
the diffraction grating device is arranged in a plurality of grating portions including a portion of the diffraction grating structure and a portion of the core layer, the grating portions including a first portion and a second portion,
the semiconductor mesa includes the grating portions,
the first portion of the grating portions has a first width of the semiconductor mesa,
the second portion of the grating portions has a second width of the semiconductor mesa,
the grating portions are periodically arranged with a constant period in the predetermined axis direction,
the first portion and the second portion are arranged alternately in the predetermined axis direction, and
the second width of the semiconductor mesa is larger than the first width of the semiconductor mesa.

10. A diffraction grating device comprising:
a substrate;
a first end facet and a second end facet opposite to the first end facet;
a diffraction grating structure providing a chirped grating whose pitch monotonically changes from the first end facet to the second end facet along a predetermined axis direction, the diffraction grating structure including a first layer, a second layer, and a junction between the first layer and the second layer;
a core layer that is optically coupled with the diffraction grating structure with a coupling coefficient;
the diffraction grating device is arranged in a plurality of grating portions including a portion of the diffraction grating structure and a portion of the core layer, the grating portions including a first portion and a second portion,
distances between the junction and the core layer in the first and the second portions of the grating portion are continuously changed in the predetermined axis direction,
the distance at a boundary between the first portion and the second portion is discontinuously changed,
the grating portions are periodically arranged with a constant period in the predetermined axis direction,
the first portion and the second portion are arranged alternately in the predetermined axis direction, and
an average distance between the junction and the core layer in the second portion is larger than the average distance between the junction and the core layer in the first portion.

11. A wavelength tunable filter comprising:
a substrate;
a diffraction grating device disposed on the substrate;
an electrode disposed on the diffraction grating device;
a facet receiving an input light and outputting an optical light from the diffraction grating device,
wherein the diffraction grating device includes:
a first end facet and a second end facet opposite to the first end facet;
a diffraction grating structure providing a chirped grating whose pitch monotonically changes from the first end facet to the second end facet along a predetermined axis direction;
a core layer that is optically coupled with the diffraction grating structure with a coupling coefficient; and
a perturbing layer changing the coupling coefficient between the diffraction grating structure and the core layer, wherein
the diffraction grating device is arranged in a plurality of grating portions including a portion of the diffraction grating structure and a portion of the core layer, the grating portions including a first portion and a second portion,
the perturbing layer is disposed at the first portion or the second portion,
the grating portions are periodically arranged with a constant period in the predetermined axis direction, and
the first portion and the second portion are arranged alternately in the predetermined axis direction.

12. The wavelength tunable filter according to claim 11, further comprising:
an optical element that is optically coupled with the diffraction grating device in series,
wherein the optical element is either a ring resonator or a Fabry-Perot etalon.

* * * * *

UNITED STATES PATENT AND TRADEMARK OFFICE
CERTIFICATE OF CORRECTION

PATENT NO. : 8,040,933 B2  
APPLICATION NO. : 12/379876  
DATED : October 18, 2011  
INVENTOR(S) : Takashi Kato Page 1 of 1

It is certified that error appears in the above-identified patent and that said Letters Patent is hereby corrected as shown below:

IN THE CLAIMS:

column 19, line 22, claim 9, immediately after the phrase "a semiconductor mesa", insert the phrase --extending in the predetermined axis direction-- before ", wherein".

column 19, line 50, claim 10, immediately after the phrase "grating structure with a coupling coefficient" insert --, wherein--, and delete ";".

Signed and Sealed this  
Twenty-fourth Day of January, 2012

David J. Kappos  
*Director of the United States Patent and Trademark Office*